(12) United States Patent
Jang et al.

(10) Patent No.: US 9,748,263 B2
(45) Date of Patent: Aug. 29, 2017

(54) SEMICONDUCTOR MEMORY DEVICE

(71) Applicant: Samsung Electronics Co., Ltd., Suwon-si, Gyeonggi-do (KR)

(72) Inventors: Won-chul Jang, Yongin-si (KR); Hong-soo Kim, Seongnam-si (KR); Tae-keun Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/097,485

(22) Filed: Apr. 13, 2016

(65) Prior Publication Data

US 2017/0012052 A1 Jan. 12, 2017

(30) Foreign Application Priority Data

Jul. 9, 2015 (KR) .................. 10-2015-0097858

(51) Int. Cl.
| | |
|---|---|
| *H01L 27/115* | (2017.01) |
| *H01L 27/11582* | (2017.01) |
| *H01L 27/11565* | (2017.01) |
| *H01L 27/24* | (2006.01) |
| *H01L 45/00* | (2006.01) |
| *H01L 27/22* | (2006.01) |

(Continued)

(52) U.S. Cl.
CPC .. *H01L 27/11582* (2013.01); *H01L 27/11565* (2013.01); *H01L 27/222* (2013.01); *H01L 27/249* (2013.01); *H01L 43/08* (2013.01); *H01L 45/06* (2013.01); *H01L 45/10* (2013.01); *H01L 45/1226* (2013.01); *H01L 45/144* (2013.01); *H01L 45/146* (2013.01); *H01L 45/147* (2013.01); *H01L 45/148* (2013.01); *H01L 45/1675* (2013.01); *G11C 16/0483* (2013.01); *H01L 27/11519* (2013.01); *H01L 27/11556* (2013.01); *H01L 29/7889* (2013.01)

(58) Field of Classification Search
CPC ......... H01L 27/11524; H01L 27/11556; H01L 27/1157; H01L 27/11582
See application file for complete search history.

(56) References Cited

U.S. PATENT DOCUMENTS

| | | |
|---|---|---|
| 7,679,108 B2 | 3/2010 | Matsunaga et al. |
| 7,679,133 B2 | 3/2010 | Son et al. |

(Continued)

*Primary Examiner* — Allison P Bernstein
(74) *Attorney, Agent, or Firm* — Harness, Dickey & Pierce, P.L.C.

(57) ABSTRACT

A semiconductor memory device includes string select lines extending in a first direction, vertical pillars connected to the string select lines, sub-interconnections on the string select lines, bitlines connected to the vertical pillars through the sub-interconnections, and upper contact plugs connecting the sub-interconnections to the bitlines. The string select lines include odd and even string select lines alternately arranged in a second direction. The sub-interconnections each connect a pair of vertical pillars respectively connected to one of the odd string select lines and one of the even string select lines that are adjacent to each other. Each of the upper contact plugs is between one of the sub-interconnections and one of the bitlines. Each of the upper contact plugs is arranged more adjacent to one string select line of the adjacent string select lines to which the pair of vertical pillars connected by the sub-interconnections are connected.

20 Claims, 39 Drawing Sheets

(51) Int. Cl.
*H01L 43/08* (2006.01)
*G11C 16/04* (2006.01)
*H01L 27/11519* (2017.01)
*H01L 27/11556* (2017.01)
*H01L 29/788* (2006.01)

(56) References Cited

U.S. PATENT DOCUMENTS

| | | |
|---|---|---|
| 7,851,914 B2 | 12/2010 | Masukawa et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,716,779 B2 | 5/2014 | Kim et al. |
| 8,822,971 B2 | 9/2014 | Park et al. |
| 8,841,646 B2 | 9/2014 | Sasago et al. |
| 9,129,861 B2 * | 9/2015 | Seol ................ H01L 29/42332 |
| 2011/0199804 A1 * | 8/2011 | Son ..................... G11C 5/04 365/51 |
| 2011/0233648 A1 | 9/2011 | Seol et al. |
| 2012/0300547 A1 | 11/2012 | Choi |
| 2013/0020647 A1 | 1/2013 | Hwang et al. |
| 2013/0334702 A1 | 12/2013 | Lee |
| 2014/0197542 A1 | 7/2014 | Yun et al. |
| 2014/0198552 A1 | 7/2014 | Park et al. |
| 2014/0239376 A1 | 8/2014 | Zhang et al. |
| 2014/0241065 A1 | 8/2014 | Shim et al. |
| 2014/0264934 A1 | 9/2014 | Chen |
| 2014/0361357 A1 | 12/2014 | Maeda et al. |
| 2015/0054058 A1 | 2/2015 | Seol et al. |

* cited by examiner

SEMICONDUCTOR MEMORY DEVICE

CROSS-REFERENCE TO RELATED APPLICATION

This application claims priority under 35 U.S.C. §119 to Korean Patent Application No. 10-2015-0097858, filed on Jul. 9, 2015, in the Korean Intellectual Property Office, the disclosure of which is incorporated herein in its entirety by reference.

BACKGROUND

Inventive concepts relate to a semiconductor memory device, and more particularly, to a vertical semiconductor memory device.

In order to satisfy excellent performance and low cost of semiconductor devices, there have been efforts to increase the integration degree of the semiconductor devices. In particular, integration degree of a memory device is an important factor in determining a product price. Integration degree of a two-dimensional memory device is mainly determined by an area occupied by a unit memory cell. Hence, the integration degree of the two-dimensional memory device may be significantly affected by a technical level of a fine pattern forming technique.

However, extremely expensive equipment are used for achieving fine patterns. The integration degree of the two-dimensional memory device has been increased but is still limited. Therefore, a semiconductor memory device having a three-dimensional structure has been proposed.

SUMMARY

Inventive concepts relate to a semiconductor memory device having increased integration degree and improved reliability.

According to example embodiments of inventive concepts, a semiconductor memory device includes: string select lines extending in a first direction, the string select lines including odd string select lines alternately arranged with even string select lines in a second direction that intersects the first direction; sub-interconnections on the string select lines, the sub-interconnections each connecting a pair of vertical pillars that respectively are connected to one of the odd string select lines and one of the even string select lines that are adjacent to each other from among the string select lines; bitlines connected to the plurality of vertical pillars through the sub-interconnections, the bitlines extending in the second direction; and upper contact plugs connecting the sub-interconnections to the bitlines. Each of the upper contact plugs is between one of the sub-interconnections and one of the bitlines. A distance between each corresponding one of the upper contact plugs and a corresponding one of the odd and even string select lines connected by a corresponding one of the sub-interconnections is less than a distance between the corresponding one of the upper contact plugs and an other one of the odd and even string select lines connected to the corresponding one of the sub-interconnections.

In example embodiments, each of the sub-interconnections may include a pair of body portions and a protruding portion. The pair of body portions may be on the pair of vertical pillars connected to each other via the sub-interconnections. The protruding portion may be curved and may protrude from an extending line connecting the pair of vertical pillars.

In example embodiments, the upper contact plugs may be on the protruding portions of the sub-interconnections connected to the upper contact plugs.

In example embodiments, the vertical pillars may be arranged in a zigzag manner.

In example embodiments, the sub-interconnections may include a long sub-interconnection having a first length in the second direction and a short sub-interconnection having a second length in the second direction that is smaller than the first length, and the long sub-interconnection and the short sub-interconnection may be alternately arranged in the first direction.

In example embodiments, a protrusion distance by which a protruding portion of the short sub-interconnection protrudes in the first direction may be larger than a protrusion distance by which a protruding portion of the long sub-interconnection protrudes in the first direction.

In example embodiments, the semiconductor memory device may further include lower contact plugs on the plurality of vertical pillars. The lower contact plugs may connect the plurality of vertical pillars to the sub-interconnections. An interval by which the lower contact plugs and the upper contact plugs connected to the long sub-interconnections are shifted in the first direction may be substantially equal to an interval by which the lower contact plugs and the upper contact plugs connected to the short sub-interconnections are shifted in the first direction.

In example embodiments, the upper contact plugs that are respectively connected to the long sub-interconnection and the short sub-interconnection may be on top of different string select lines among the string select lines.

In example embodiments, the protruding portions of the long sub-interconnection and the short sub-interconnection may be arranged in a line in the first direction.

In example embodiments, the upper contact plugs may be arranged in a zigzag manner.

In example embodiments, the string select lines may include first to third string select lines sequentially arranged in the second direction, the odd string select lines may include the first and third string select lines, and the even string select lines may include the second string select line. The sub-interconnections may include first sub-interconnections and second sub-interconnections. The first sub-interconnections may each connect two of the vertical pillars respectively connected to the first and second string select lines. The second sub-interconnections may each connect two of the vertical pillars respectively connected to the second and third string select lines. The first sub-interconnections may be curved and may protrude in the first direction, and the second sub-interconnections may be curved and may protrude in a direction opposite to the first direction.

In example embodiments, the first sub-interconnections may include first long sub-interconnections having a first length in the second direction and first short sub-interconnections having a second length in the second direction that is smaller than the first length. The second sub-interconnections may include second long sub-interconnections having the first length in the second direction and second short sub-interconnections having the second length. The vertical pillars connected to the second string select lines may include first to fourth vertical pillars respectively connected to the first long sub-interconnections, the first short sub-interconnections, the second long sub-interconnections, and the second short sub-interconnections. The first and second vertical pillars may be alternately arranged adjacent to the first string select line in a zigzag manner in the first direction.

The third and fourth vertical pillars may be alternately arranged adjacent to the third string select line in a zigzag manner in the first direction.

In example embodiments, an interval between the first vertical pillar and the fourth vertical pillar in the second direction may be substantially equal to an interval between the second vertical pillar and the third vertical pillar in the second direction.

According to example embodiments of inventive concepts, a semiconductor memory device includes: a string select line extending in a first direction; first and second vertical pillars connected to the string select line, the first and second pillars arranged in a zigzag manner; a first lower contact plug on the first vertical pillar; a first sub-interconnection connected to the first vertical pillar through the first lower contact plug, the first sub-interconnection extending in a second direction; a second lower contact plug on the second vertical pillar; a second sub-interconnection connected to the second vertical pillar through the second lower contact plug, the second sub-interconnection extending in the second direction, a length of the second sub-interconnection being different than a length of the first sub-interconnection; a first bitline on the string select line and extending in the second direction; a first upper contact plug connecting the first bitline to the first sub-interconnection, the first upper contact plug in a plan view being shifted from the first vertical pillar in the first direction; a second bitline on the string select line and extending in the second direction; and a second upper contact plug connecting the second bit line to the second sub-interconnection, the second upper contact plug in the plan view being shifted from the second vertical pillar in the first direction, and the first upper contact plug and the second upper contact plug being arranged in a zigzag manner in the plan view.

In example embodiments, each of the first and second sub-interconnections may include a body portion and a protruding portion extending in the second direction. The protruding portion may be curved and may protrude from the body in the first direction. The first upper contact plug may be on the protruding portion of the first sub-interconnection. The second upper contact plug may be on the protruding portion of the second sub-interconnection.

According to example embodiments, a semiconductor memory device includes string select lines extending in a first direction, the string select lines being spaced apart from each other in a second direction that crosses the first direction; vertical pillars extending a third direction through the string select lines, the vertical pillars being spaced apart from each other, the third direction being perpendicular to a top surface of the string select lines; sub-interconnections on top of the vertical pillars, each of the sub-interconnections including two end portions that are respectively on top of and connected to two different vertical pillars that respectively extend through two different string select lines among the vertical pillars and the string select lines; bitlines on top of the sub-interconnections; and upper contact plugs between the bitlines and the sub-interconnections, each of the upper contact plugs being arranged between one of the bitlines and one of the string select lines in the third direction so as to not overlap the vertical pillars in a plan view.

In example embodiments, the semiconductor memory device may further include gate lines spaced apart from each other in the third direction, a substrate including a common source line, and information storage elements between the vertical pillars and the gate lines. The gate lines may be on the substrate. The string select lines may be on the gate lines. The vertical pillars may extend through the gate lines.

In example embodiments, the sub-interconnections may include long sub-interconnections having a first length in the second direction and short sub-interconnections having a second length in the second direction that is smaller than the first length. The long sub-interconnections and the short sub-interconnections may be alternately arranged in the first direction, and the long sub-interconnections and the short sub-interconnections may be alternately arranged in the second direction.

In example embodiments, the sub-interconnections may each include a protruding portion. The protruding portions may be over spaces between the string select lines. The string select lines may include first to third string select lines spaced apart from each other in the second direction. The second string select line may be between the first and third string select lines. The protruding portions of the sub-interconnections that connect the first string select line to the second string select line may protrude in a direction opposite the first direction in the plan view, and the protruding portions of the sub-interconnections that connect the second string select line to the third string select line may protrude in the first direction in the plan view.

In example embodiments, the protruding portions may include diagonal portions that connect to the end portions of the sub-interconnections, and the upper contact plugs may be between the bitlines and one of the diagonal portions in each of the sub-interconnections in the third direction.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
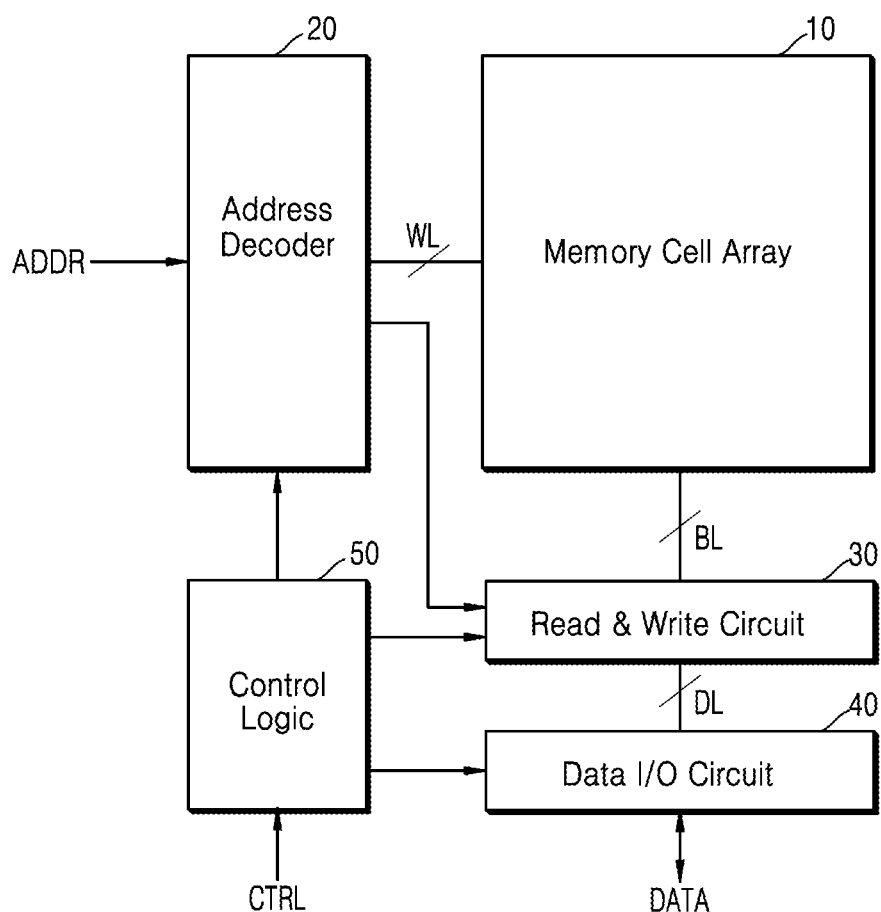
FIG. 1 is a block diagram of a semiconductor memory device according to example embodiments.

Hereinafter, example embodiments of inventive concepts will be described with reference to the accompanying drawings. Example embodiments of inventive concept mays, however, be embodied in many different forms and should not be construed as being limited to the example embodiments set forth herein; rather, these example embodiments are provided so that this disclosure will be thorough and complete, and will fully convey the scope of inventive concepts to those of ordinary skill in the art. In the drawings, the dimensions of structures are exaggerated for clarity. As used herein, the term "and/or" includes any and all combinations of one or more of the associated listed items Like reference characters and/or numerals in the drawings denote like elements, and thus their description may not be repeated. Expressions such as "at least one of" when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between," versus "directly between," "adjacent," versus "directly adjacent," etc.).

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the teachings of example embodiments of inventive concepts.

The terminology used herein is for the purpose of describing particular embodiments only and is not intended to be limiting of example embodiments of inventive concepts. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Unless otherwise defined, all terms used in this specification will be construed as general meanings commonly understood by one of ordinary skill in the art.

Hereinafter, example embodiments of inventive concepts will be described in detail with reference to the accompanying drawings.

FIG. 1 is a block diagram of a semiconductor memory device according to example embodiments.

Referring to FIG. 1, the semiconductor memory device 100 may include a memory cell array 10, an address decoder 20, a read/write circuit 30, a data input/output circuit 40, and a control logic 50.

The memory cell array 10 may be connected to the address decoder 20 through a plurality of word lines WL, and may be connected to the read/write circuit 30 through a plurality of bitlines BL. The memory cell array 10 may include a plurality of memory cells. For example, the memory cell array 10 may be configured such that each single cell stores one or more bits.

The address decoder 20 may be connected to the memory cell array 10 through the word lines WL. The address decoder 20 may be configured to operate in response to control of the control logic 50. The address decoder 20 may receive addresses ADDR from the outside. The address decoder 20 may decode a row address of the received addresses ADDR to select a relevant word line from among the plurality of word lines WL. Also, the address decoder 20 may decode a column address of the received addresses ADDR and transfer a decoded column address to the read/write circuit 30. The address decoder 20 may include components such as a row decoder, a column decoder, and an address buffer.

The read/write circuit 30 may be connected to the memory cell array 10 through the bitlines BL and may be connected to the data input/output circuit 40 through data lines DL. The read/write circuit 30 may operate in response to the control of the control logic 50. The read/write circuit 30 may be configured to receive the decoded column address from the address decoder 20. The read/write circuit 30 may select a relevant bitline from among the plurality of bitlines BL by using the decoded column address. For example, the read/write circuit 30 may receive data from the data input/output circuit 40 and write the received data in the memory cell array 10. The read/write circuit 30 may read data from the memory cell array 10 and transfer the read data to the data input/output circuit 40. The read/write circuit 30 may read data from a first storage area of the memory cell array 10 and write the read data in a second storage area of the memory cell array 10. For example, the read/write circuit 30 may be configured to perform a copy-back operation.

The read/write circuit 30 may include components including a page buffer (or a page register) and a column selection circuit. As another example, the read/write circuit 30 may include components including a sensing amplifier, a write driver, and a column selection circuit.

The data input/output circuit 40 may be connected to the read/write circuit 30 through the plurality of data lines DL. The data input/output circuit 40 may operate in response to control of the control logic 50. The data input/output circuit 40 may be configured to exchange data DATA with the outside. The data input/output circuit 40 may be configured to transfer the data DATA, which is transferred to the outside, to the read/write circuit 30 through the plurality of data lines DL. The data input/output circuit 40 may be configured to output the data DATA, which is transferred from the read/write circuit 30 through a plurality of data lines DL, to the outside. For example, the data input/output circuit 40 may include a component, such as a data buffer.

The control logic 50 may be connected to the address decoder 20, the read/write circuit 30, and the data input/output circuit 40. The control logic 50 may be configured to control an operation of the semiconductor memory device 100. The control logic 50 may operate in response to a control signal CTRL transferred from the outside.

Figure 2:
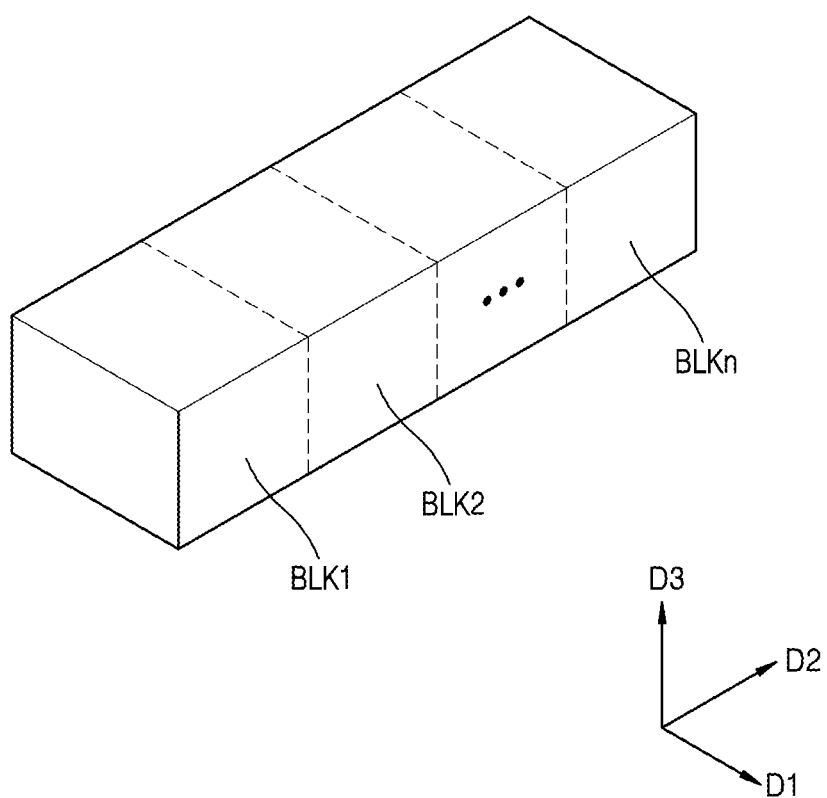
FIG. 2 is a block diagram illustrating an example of a memory cell array of a semiconductor memory device, according to example embodiments.

FIG. 2 is a block diagram illustrating an example of a memory cell array of a semiconductor memory device, according to example embodiments. Specifically, FIG. 2 is a block diagram illustrating an example of the memory cell array 10 of FIG. 1.

Referring to FIG. 2, the memory cell array 10 may include a plurality of memory blocks BLK1 to BLKn. Each of the memory blocks BLK1 to BLKn may have a three-dimensional structure (or a vertical structure). For example, each of the memory blocks BLK1 to BLKn may include structures extending in first to third directions D1, D2, and D3. For example, each of the memory blocks BLK1 to BLKn may include a plurality of cell strings extending in the third direction D3.

Figure 3:
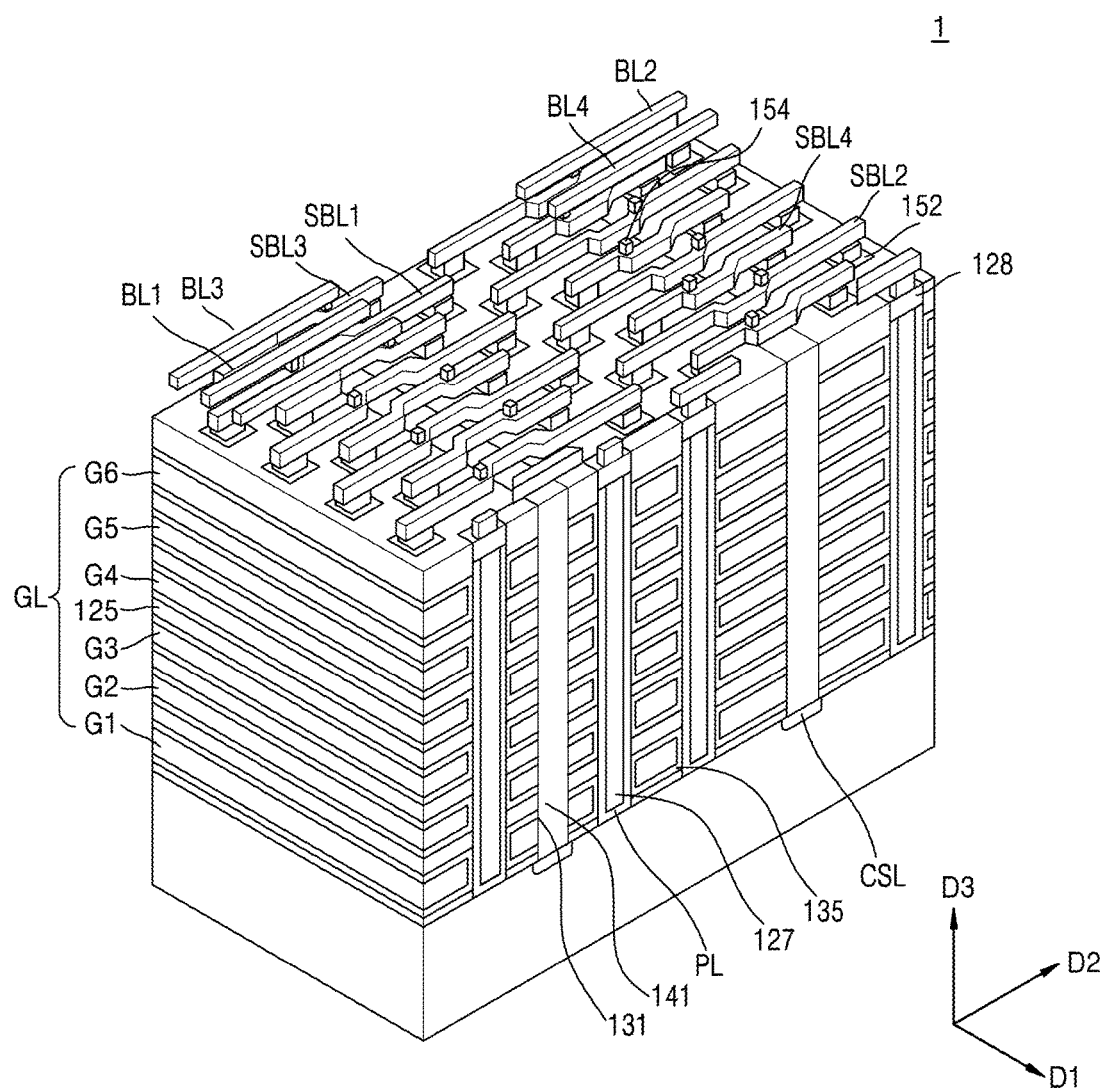
FIG. 3 is a perspective view of a memory block of a semiconductor memory device, according to example embodiments.
Figure 4:
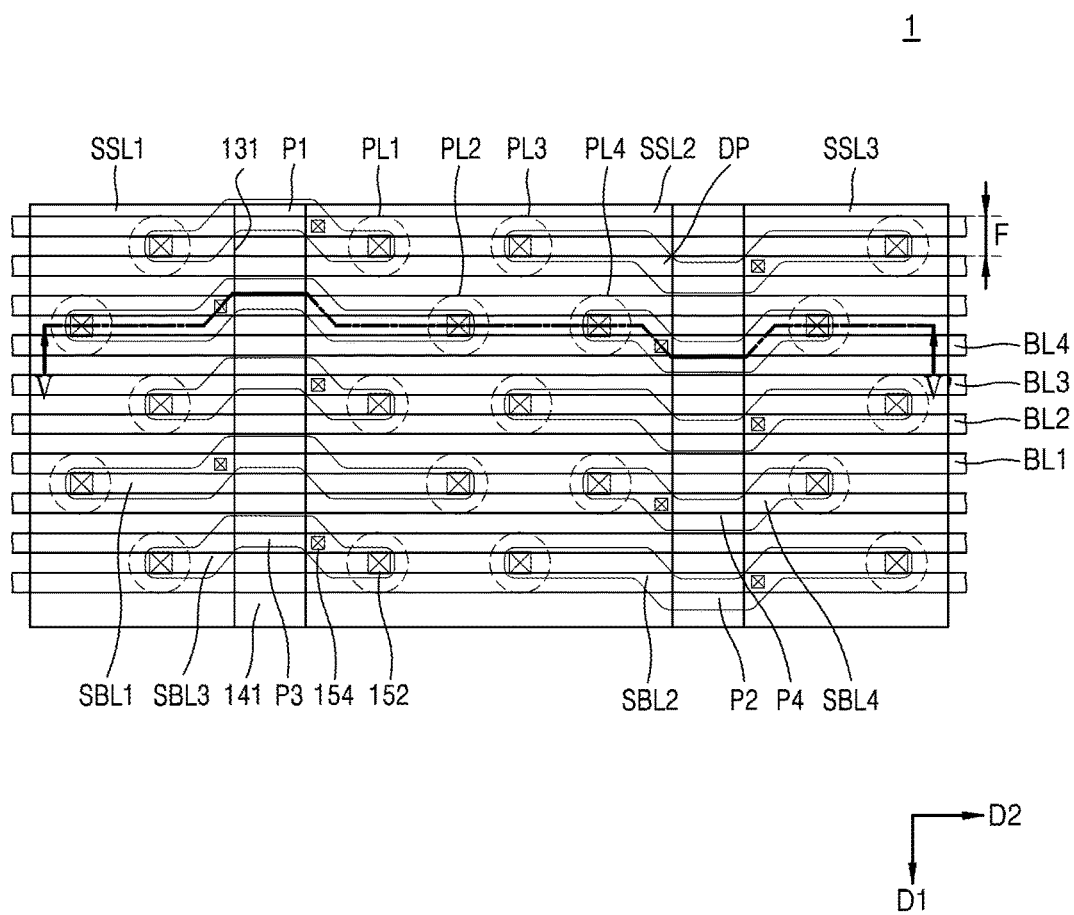
FIG. 4 is a plan view of the semiconductor memory device of FIG. 3.
Figure 5:
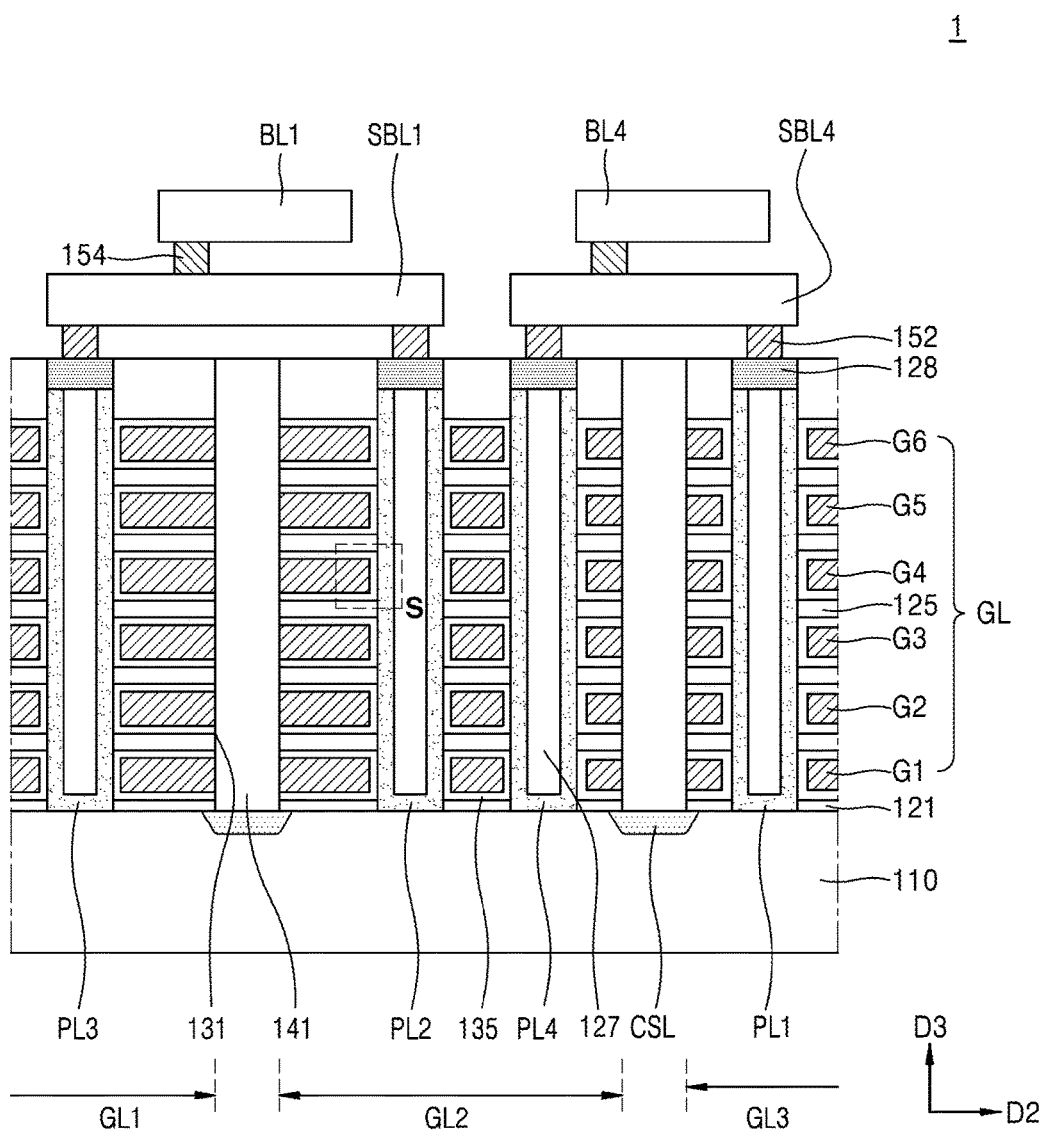
FIG. 5 is a cross-sectional view taken along line V-V' of FIG. 4.

FIG. 3 is a perspective view of a memory block of a semiconductor memory device, according to example embodiments. FIG. 4 is a plan view of the semiconductor memory device of FIG. 3, and FIG. 5 is a cross-sectional view taken along line V-V' of FIG. 4. In some of FIGS. 3 to 5, at least one or all of some elements may be omitted for convenience of illustration.

Referring to FIGS. 3 to 5, the semiconductor memory device 1 may include a substrate 110 and a plurality of gate structures GL disposed on the substrate 110.

The substrate 110 may include a semiconductor material. The substrate 110 may include, for example, silicon (Si). Alternatively, the substrate 110 may include a semiconductor element, such as germanium (Ge), or a compound semiconductor material, such as silicon carbide (SiC), gallium arsenide (GaAs), indium arsenide (InAs), and indium phosphide (InP). As another example, the substrate 110 may have a semiconductor on insulator (SOI) structure such as a silicon on insulator structure. For example, the substrate 110 may include a buried oxide (BOX) layer. The substrate 110 may include a conductive region, for example, a well doped with an impurity. The substrate 110 may have various device isolation structures, such as a shallow trench isolation (STI) structure or a deep trench isolation (DTI) structure. The substrate 110 may have a first conductivity type, for example, a P type.

A buffer dielectric film 121 may be disposed between the substrate 110 and the gate structure GL. The buffer dielectric film 121 may include a silicon oxide, a silicon nitride, a silicon oxynitride, a gallium oxide, a germanium oxide, a high-k dielectric, or any combinations thereof.

The gate structure GL may extend in a first direction D1. Two adjacent gate structures GL may face each other in a second direction D2 perpendicular to the first direction D1. The gate structure GL may include a plurality of insulating patterns 125 and a plurality of gate electrodes G1 to G6 spaced apart from one another with the plurality of insulating patterns 125 being disposed therebetween. The plurality of gate electrodes G1 to G6 may include first to sixth gate electrodes G1 to G6 sequentially stacked on the substrate 110. The insulating pattern 125 may include a silicon oxide. The buffer dielectric film 121 may be thinner than the insulating pattern 125. The plurality of gate electrodes G1 to G6 may include a doped polysilicon, a metal, a metal nitride, a metal silicide or a combination thereof. Although the number of the plurality of gate electrodes G1 to G6 is illustrated as being six in FIGS. 3 and 5, example embodiments are not limited thereto and the number of the plurality of gate electrodes may be different than six (e.g., seven or more, or five or less).

An isolation region 131 extending in the first direction D1 may be provided between the adjacent gate structures GL. The isolation region 131 may be filled with an isolation insulating film 141. Common source lines CSL may be formed in a partial upper portion of the substrate 110 under the isolation region 131. The common source lines CSL may be spaced apart from one another and may extend in the first direction in the substrate 110. The common source lines CSL may have a second conductivity type (e.g., N type) that is different from the first conductivity type. Unlike FIGS. 3 and 5, the common source lines CSL may be disposed between the substrate 110 and the first gate electrode G1 and may have a line-shaped pattern extending in the first direction D1.

A plurality of vertical pillars PL (e.g., PL1, PL2, PL3) connected to the gate structures GL may be disposed on the substrate 110. The plurality of vertical pillars PL may be connected to the substrate 110 by passing through the plurality of gate electrodes G1 to G6. The plurality of vertical pillars PL may extend from the substrate 110 in a third direction D3. One end of the vertical pillar PL may be connected to the substrate 110, and the other end may be connected to any one of the plurality of bitlines BL1, BL2, BL3, and BL4.

Sub-interconnections SBL1, SBL2, SBL3, and SBL4 are disposed between the vertical pillars PL and the bitlines BL1, BL2, BL3, and BL4. The vertical pillar PL may be connected to one of the sub-interconnections SBL1, SBL2, SBL3, and SBL4 through lower contact plugs 152. The bitlines BL1, BL2, BL3, and BL4 may be connected to the sub-interconnections SBL1, SBL2, SBL3, and SBL4 through upper contact plugs 154. The sub-interconnections SBL1, SBL2, SBL3, and SBL4 may connect a pair of vertical pillars PL connected to adjacent gate structures GL through the lower contact plugs 152.

A plurality of cell strings of the semiconductor memory device may be provided between the bitlines BL1, BL2, BL3, and BL4 and the common source lines CSL. One cell string may include a string select transistor connected to the bitlines BL1, BL2, BL3, and BL4, a ground select transistor connected to the common source lines CSL, and a plurality of memory cells provided between (e.g., stacked on top of each other between) the string select transistor and the ground select transistor. The string select transistor, the ground select transistor, and the plurality of memory cells may be provided in one semiconductor pillar PL. The first gate electrode G1 may be a ground select gate line GSL of the ground select transistor. The second to fifth gate electrodes G2 to G5 may be cell gates of the plurality of memory cells. The sixth gate electrode G6 may be a string select gate line SSL of the string select transistor.

The plurality of gate structures GL may include first to third gate structures GL1, GL2, and GL3 sequentially arranged adjacent to one another. Sixth gate electrodes G6 of the first to third gate structures GL1, GL2, and GL3 may be respectively referred to as first to third string select lines SSL1, SSL2, and SSL3. The first to third string select lines SSL1 to SSL3 may be sequentially arranged in the second direction D2. The string select lines may also be referred to as odd string select lines (e.g., SSL1 and SSL3) and even string select lines (e.g., SSL2). Although not illustrated, the string select line SSL3 may be between the string select line SSL2 and another string select line (e.g., SSL4 not shown) that spaced apart from the string select line SSL3 in the second direction similar to how the string select line SSL2 is between the string select lines SSL1 and SSL3. In other words, a plurality of odd string select lines and even string select lines may be alternately arranged and spaced apart from each other in the second direction.

Information storage elements 135 may be disposed between the first to sixth electrodes G1 to G6 and the vertical pillar PL. Although the information storage elements 135 are illustrated as extending between the gate electrodes G1, G2, G3, G4, G5, and G6 and the insulating patterns 125 and extending between the first to sixth gate electrodes G1 to G6 and the vertical pillar PL in FIGS. 3 and 5, example embodiments are not limited thereto. The information storage elements 135 may be variously modified as in examples of FIGS. 6A to 6I to be described below.

The vertical pillar PL may be a semiconductor pillar including a semiconductor material. The vertical pillar PL may function as a channel. The vertical pillars PL may be solid-cylindrical pillars or hollow-cylindrical (e.g., macaroni-type) pillars. When the vertical pillars PL are macaroni-type pillars, the vertical pillars PL may be filled with a filling insulating film 127. The filling insulating film 127 may include a silicon oxide film. The filling insulating film 127 may be in direct contact with inner walls of the vertical pillars PL.

The vertical pillars PL and the substrate 110 may be a semiconductor material having a substantially continuous structure. In this case, the vertical pillars PL may be a single-crystalline semiconductor material. Alternatively, the vertical pillars PL and the substrate 110 may have a discontinuous interface. In this case, the vertical pillars PL may be a semiconductor material having a polycrystalline or amorphous structure. Conductive patterns 128 may be disposed at one ends of the vertical pillars PL. The one ends of the vertical pillars PL which be in contact with the conductive patterns 128 may be drain regions.

The plurality of vertical pillars PL may be arranged in a zigzag manner in the first direction D1. Alternatively, the plurality of vertical pillars PL may be arranged in a zigzag manner in the second direction D2. The plurality of vertical pillars PL may include first to fourth pillars PL1 to PL4 sequentially arranged in a zigzag manner in the second direction D2. The first and second vertical pillars PL1 and PL2 may be connected to the gate structures GL1, GL2 and GL3 at one ends of the string select lines SSL1, SSL2, and SSL3. The third and fourth vertical pillars PL3 and PL4 may be connected to the gate structures GL1, GL2 and GL3 at the other ends of the string select lines SSL1, SSL2, and SSL3.

The first and fourth vertical pillars PL1 and PL4 may be disposed in edges of the string select lines SSL1, SSL2, and SSL3. The second and third vertical pillars PL2 and PL3 may be disposed between the first vertical pillar PL1 and the fourth vertical pillar PL4. That is, the first and second vertical pillars PL1 and PL2 may be alternately arranged in a zigzag manner in the first direction D1 at one end of the string select lines SSL1, SSL2, and SSL3, and the third and fourth vertical pillars PL3 and PL4 may be alternately arranged in a zigzag manner in the first direction D1 at the other end of the string select lines SSL1, SSL2, and SSL3.

The second vertical pillar PL2 may be shifted from the first vertical pillar PL1 in the first direction D1. The fourth vertical pillar PL4 may be shifted from the third vertical pillar PL3 in the first direction D1. Two immediately adjacent vertical pillars among the plurality of vertical pillars PL may be spaced apart from each other by two times a pitch F of the plurality of bitlines BL1 to BL4 in the first direction D1. An interval between the first vertical pillar PL1 and the third vertical pillar PL3 may be substantially equal to an interval between the second vertical pillar PL2 and the fourth vertical pillar PL4.

A plurality of sub-interconnections SBL1 to SBL4 may include first to fourth sub-interconnections SBL1, SBL2, SBL3, and SBL4. The first sub-interconnection SBL1 may connect the third vertical pillar PL3 of the first string select line SSL1 to the second vertical pillar PL2 of the second string select line SSL2. The second sub-interconnection SBL2 may connect the third vertical pillar PL3 of the second string select line SSL2 to the second vertical pillar PL2 of the third string select line SSL3. The third sub-interconnection SBL3 may connect the fourth vertical pillar PL4 of the first string select line SSL1 to the first vertical pillar PL1 of the second string select line SSL2. The fourth sub-interconnection SBL4 may connect the fourth vertical pillar PL4 of the second string select line SSL2 to the first vertical pillar PL1 of the third string select line SSL3. The first sub-interconnection SBL1 and the third sub-interconnection SBL3 may be alternately arranged in the first direction D1, and the second sub-interconnection SBL2 and the fourth sub-interconnection SBL4 may be alternately arranged in the first direction D1. The first sub-interconnection SBL1 and the fourth sub-interconnection SBL4 may be alternately arranged in the second direction D2, and the second sub-interconnection SBL2 and the third sub-interconnection SBL3 may be alternately arranged in the second direction D2. The first to fourth sub-interconnections SBL1 to SBL4 may be connected to other bitlines BL1 to BL4 adjacent to one another. For example, the first sub-interconnection SBL1 may be connected to the first bitline BL1, the second sub-interconnection SBL2 may be connected to the second bitline BL2, the third sub-interconnection SBL3 may be connected to the third bitline BL3, and the fourth sub-interconnection SBL4 may be connected to the fourth bitline BL4.

Lower contact plugs 152 may be disposed on the vertical pillars PL1, PL2, PL3, and PL4, and upper contact plugs 154 may be disposed on the sub-interconnections SBL1, SBL2, SBL3, and SBL4. The upper contact plugs 154 on the first and second sub-interconnections SBL1 and SBL3 may be shifted from the lower contact plugs 152 in a direction opposite to the first direction D1. The upper contact plugs 154 on the second and fourth sub-interconnections SBL2 and SBL4 may be shifted from the lower contact plugs 152 in the first direction D1.

The first and third sub-interconnections SBL1 and SBL3 may extend in the second direction D2, and may be curved and protrude in the direction opposite to the first direction D1. That is, the first and third sub-interconnections SBL1 and SBL3 may have protruding portions P1 and P3 which are curved and protrude in the direction opposite to the first direction D1. The second and fourth sub-interconnections SBL2 and SBL4 may extend in the second direction D2, and may be curved and protrude in the first direction D1. That is, the second and fourth sub-interconnections SBL2 and SBL4 may have protruding portions P2 and P4 which are curved and protrude in the first direction D1. A portion other than the protruding portions P1, P2, P3, and P4 in the first to fourth sub-interconnections SBL1, SBL2, SBL3, and SBL4, that is, a portion extending in the second direction D2 may be referred to as a body portion. A portion of the protruding portions (e.g., P1) may include a diagonal portion DP that connects to the body portions of the sub-interconnections (e.g., SBL1). The body portions of the sub-interconnection may also be referred to as end portions.

The protruding portion P1 of the first sub-interconnection SBL1 and the protruding portion P3 of the third sub-interconnection SBL3 may be arranged in a row in the first direction D1 on the isolation insulating film 141, and the protruding portion P2 of the second sub-interconnection SBL2 and the protruding portion P4 of the fourth sub-interconnection SBL4 may be arranged in a row in the first direction D1 on the isolation insulating film 141.

A length by which the first and second sub-interconnections SBL1 and SBL2 extend in the second direction D2 may be larger than a length by which the third and fourth sub-interconnections SBL3 and SBL4 extend in the second direction D2. Therefore, the first and second sub-interconnections SBL1 and SBL2 may be referred to as long sub-interconnections and the third and fourth sub-interconnections SBL3 and SBL4 may be referred to as short sub-interconnections.

A protrusion distance by which the protruding portions P1, P2, P3, and P4 of the sub-interconnections SBL1, SBL2, SBL3, and SBL4 protrude in the first direction D1 or the direction opposite to the first direction D1 may be larger than a distance by which the upper contact plugs 154 are shifted from the lower contact plugs 152 in the first direction D1 or the direction opposite to the first direction D1. In this case, the protrusion distance refers to the shortest distance from an extending line which extends in the second direction D2 between both ends of the sub-interconnections SBL1, SBL2, SBL3, and SBL4 to apexes of the protruding portions P1, P2, P3, and P4 of the sub-interconnections SBL1, SBL2, SBL3, and SBL4.

For example, the upper contact plugs 154 on the first and second sub-interconnections SBL1 and SBL3 may be shifted from the lower contact plugs 152 in the direction opposite to the first direction D1 by half the pitch F of the plurality of bitlines BL1 to BL4. The upper contact plugs 154 on the second and fourth sub-interconnections SBL2 and SBL4 may be shifted from the lower contact plugs 152 in the first direction D1 by half the pitch F of the plurality of bitlines BL1 to BL4. The protrusion distance by which the protruding portions P1 and P3 of the first and third sub-interconnections SBL1 and SBL3 protrude in the direction opposite to the first direction D1 may be lager than half the pitch F of the plurality of bitlines BL1 to BL4. The protrusion distance by which the protruding portions P2 and P4 of the second and fourth sub-interconnections SBL2 and SBL4 protrude in the first direction D1 may be lager than half the pitch F of the plurality of bitlines BL1 to BL4.

Also, the protrusion distance by which the protruding portion P1 of the first sub-interconnection SBL1 protrudes in the direction opposite to the first direction D1 may be lager than the protrusion distance by which the protruding portion P3 of the third sub-interconnection SBL3 protrudes, and the protrusion distance by which the protruding portion P2 of the second sub-interconnection SBL2 protrudes in the first direction D1 may be lager than the protrusion distance by which the protruding portion P4 of the fourth sub-interconnection SBL4 protrudes.

That is, the protrusion distance by which the protruding portions P1 and P2 of the long sub-interconnections SBL1 and SBL2 protrude in the direction opposite to the first direction D1 or the first direction D1 may be larger than the protrusion distance by which the protruding portions P3 and P4 of the short sub-interconnections SBL3 and SBL4 protrude in the direction opposite to the first direction D1 or the first direction D1. However, the distance by which the upper contact plugs 154 on the long sub-interconnections SBL1 and SBL2 are shifted from the lower contact plugs 152 in the direction opposite to the first direction D1 or the first direction D1 may be substantially equal to the distance by which the upper contact plugs 154 on the short sub-interconnections SBL3 and SBL4 are shifted from the lower contact plugs 152 in the direction opposite to the first direction D1 or the first direction D1.

The upper contact plugs 154 on the sub-interconnections SBL1 to SBL4 may be disposed to be more adjacent to one string select line of adjacent string select lines SSL1, SSL2, and SSL3 connecting a pair of vertical pillars PL1, PL2, PL3, and PL4 connected by the sub-interconnections SBL1 to SBL4.

The upper contact plugs 154 on the first and third sub-interconnections SBL1 and SBL3 may be arranged in a zigzag manner in the first direction D1. The upper contact plugs 154 on the second and fourth sub-interconnections SBL2 and SBL4 may be arranged in a zigzag manner in the first direction D1.

For example, the upper contact plug 154 on the first sub-interconnection SBL1 may be disposed adjacent to the first string select line SSL1, and the upper contact plug 154 on the third sub-interconnection SBL3 may be disposed adjacent to the second string select line SSL2. Also, the upper contact plug 154 on the second sub-interconnection SBL2 may be disposed adjacent to the third string select line SSL3, and the upper contact plug 154 on the fourth sub-interconnection SBL4 may be disposed adjacent to the second string select line SSL2. However, an arrangement of the upper contact plugs 154 is not limited thereto. The upper contact plug 154 on the first sub-interconnection SBL1 may be disposed adjacent to the second string select line SSL2, the upper contact plug 154 on the third sub-interconnection SBL3 may be disposed adjacent to the first string select line SSL1, the upper contact plug 154 on the second sub-interconnection SBL2 may be disposed adjacent to the second string select line SSL2, and the upper contact plug 154 on the fourth sub-interconnection SBL4 may be disposed adjacent to the third string select line SSL3.

In the semiconductor memory device 1 according to example embodiments, the vertical pillars PL1, PL2, PL3, and PL4 may be arranged in a zigzag manner in the first direction D1 and the second direction D2 and may be connected to the bitlines BL1, BL2, BL3, and BL4 through the sub-interconnections SBL1, SBL2, SBL3, and SBL4 having the protruding portions P1, P2, P3 and P4, decreasing an effective area for one channel. Therefore, a unit cell area may be reduced and integration degree may be increased. Accordingly, program speed and read speed may be improved.

Also, the upper contact plugs 154 connecting the sub-interconnections SBL1, SBL2, SBL3, and SBL4 and the bitlines BL1, BL2, BL3, and BL4 may be arranged in a zigzag manner, forming the bitlines BL1, BL2, BL3, and BL4 having a relatively small pitch and improving integration degree of the semiconductor memory device 1.

Also, a distance by which the lower contact plugs 152 are shifted from the upper contact plugs 154 may be smaller than a protrusion distance by which the protruding portions P1, P2, P3, and P4 of the sub-interconnections SBL1, SBL2, SBL3, and SBL4 protrude in the first direction D1, limiting and/or preventing misalignment between the sub-interconnections SBL1, SBL2, SBL3, and SBL4 and the upper contact plugs 154 and improving reliability of electrical connection between the sub-interconnections SBL1, SBL2, SBL3, and SBL4 and the bitlines BL1, BL2, BL3, and BL4.

FIGS. 6A to 6I are enlarged views of portion S of FIG. 5.

Figure 6A:
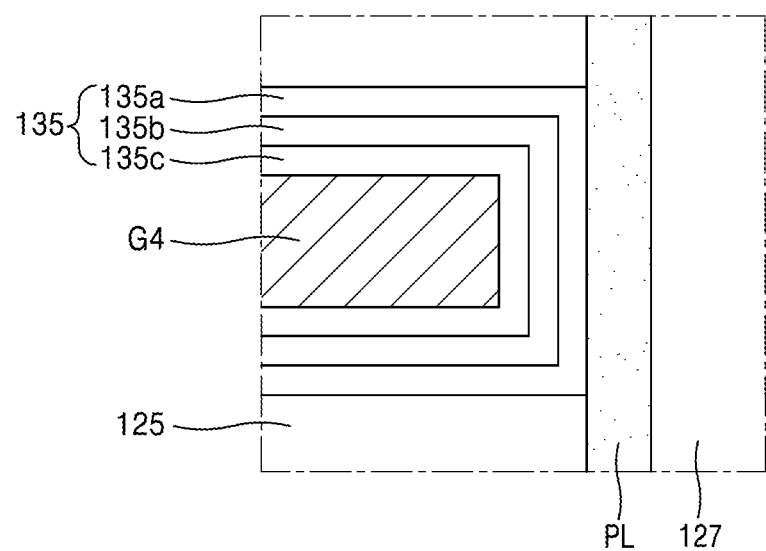
FIGS. 6A to 6I are enlarged views of portion S of FIG. 5.

Referring to FIG. 6A, the information storage element 135 may include a blocking insulating film 135c adjacent to the gate electrode G4, a tunnel insulating film 135a adjacent to the vertical pillars PL, and a charge storage film 135b disposed between the blocking insulating film 135c and the tunnel insulating film 135a. The information storage elements 135 may extend between the gate electrode G4 and the insulating patterns 125.

The blocking insulating film 135c may include a high-k dielectric film. The high-k dielectric film may include one selected from the group consisting of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, and any combinations thereof, but is not limited thereto.

The blocking insulating film 135c may include a multi-layered film including a plurality of thin films. For example, the blocking insulating film 135c may be a multi-layered film including at least two thin films of an aluminum oxide film, a hafnium oxide film, a hafnium silicon oxide film, a zirconium oxide film, a zirconium silicon oxide film, and a silicon oxide film. A stacking order of layers forming the blocking insulating film 135c may be varied.

The charge storage film 135b may be an insulating film including a charge trapping film or conductive nanoparticles. The charge trapping film may include a material of which the dielectric constant is larger than that of a silicon oxide film and is smaller than that of the blocking insulating film 135c. For example, when the dielectric constant of the silicon oxide film is 3.9, the charge trapping film may include a silicon nitride film having a dielectric constant of about 6. The charge trapping film may include a nitride film, such as a silicon nitride film, an aluminum nitride film, or a silicon oxynitride film.

The tunnel insulating film 135a may be a silicon oxide film or an insulating film having a high dielectric constant.

Figure 6B:
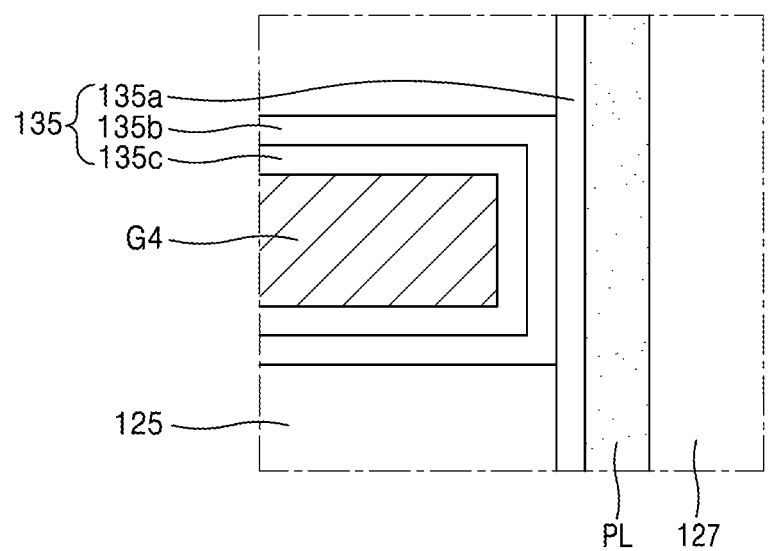
Figure 6C:
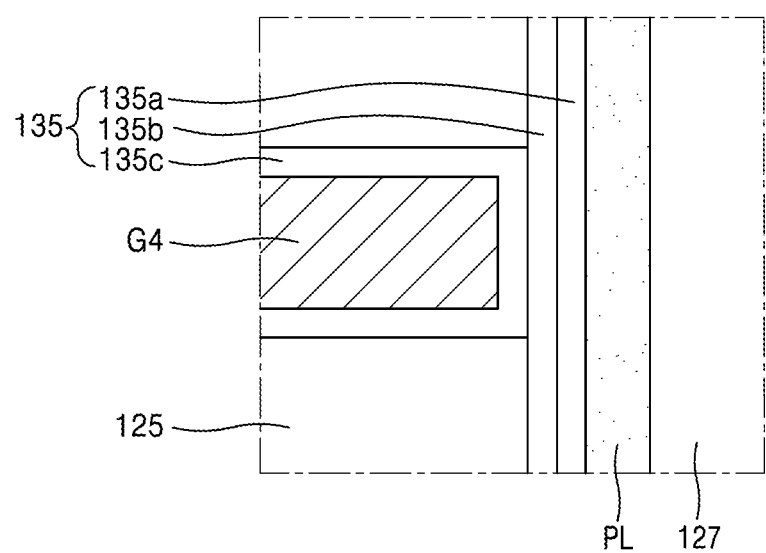
Figure 6D:
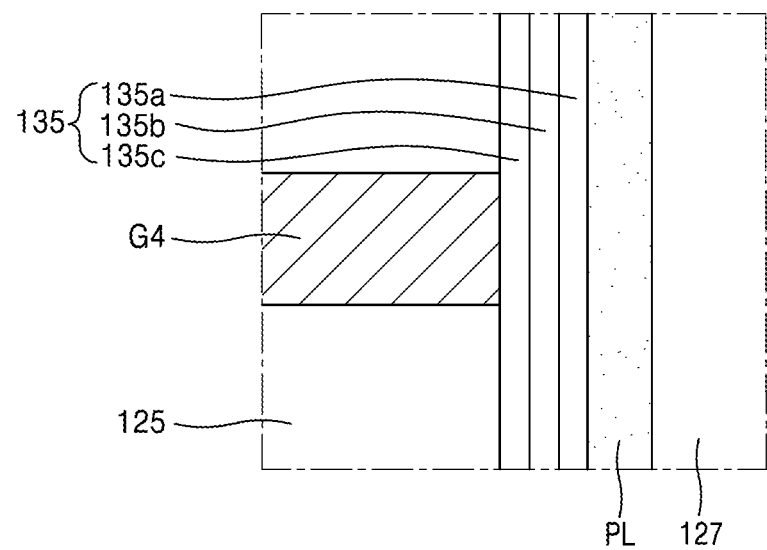

Referring to FIGS. 6B to 6D, at least some of the information storage elements 135 may extend between the insulating patterns 125 and the vertical pillars PL unlike what is illustrated in FIG. 5.

Referring to FIG. 6B, the tunnel insulating film 135a may extend between the insulating patterns 125 and the vertical pillars PL, and the charge storage film 135b and the blocking insulating film 135c may extend between the insulating patterns 125 and the gate electrode G4.

Referring to FIG. 6C, the tunnel insulating film 135a and the charge storage film 135b may extend between the insulating patterns 125 and the vertical pillars PL, and the blocking insulating film 135c may extend between the insulating patterns 125 and the gate electrode G4.

Referring to FIG. 6D, the tunnel insulating film 135a, the charge storage film 135b, and the blocking insulating film 135c may extend between the insulating patterns 125 and the vertical pillars PL.

Figure 6E:
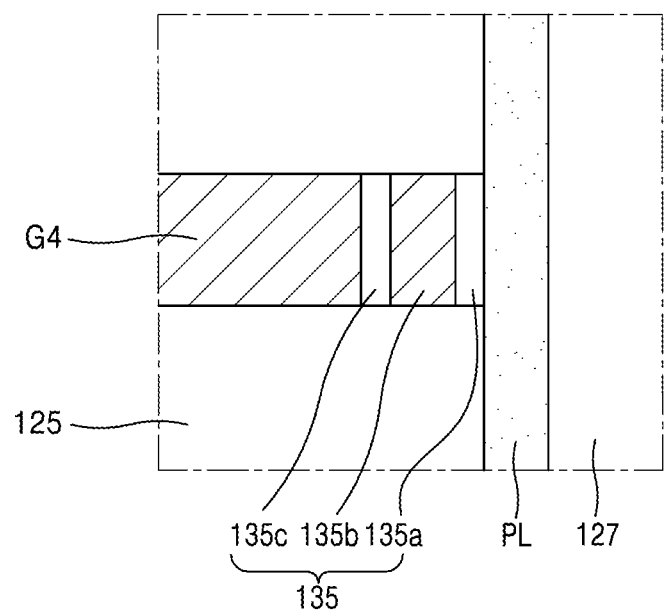

Referring to FIG. 6E, the charge storage film 135b may be a doped polysilicon. In this case, the tunnel insulating film 135a, the charge storage film 135b, and the blocking insulating film 135c may be limited to be disposed between the gate electrode G4 and the vertical pillars PL. In example embodiments, the vertical pillars PL may be conductive pillars. The vertical pillar PL may include at least one conductive material of, for example, doped polysilicon, metal, conductive metal nitride, silicide, or nanostructures, such as carbon nanotubes or graphene.

Figure 6F:
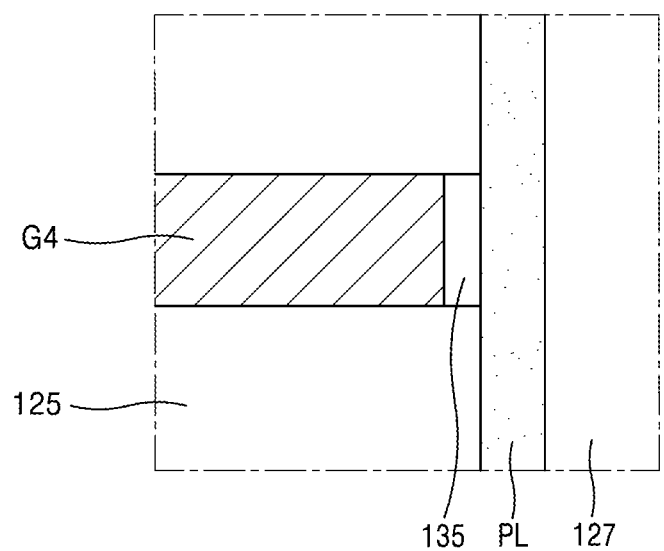
Figure 6G:
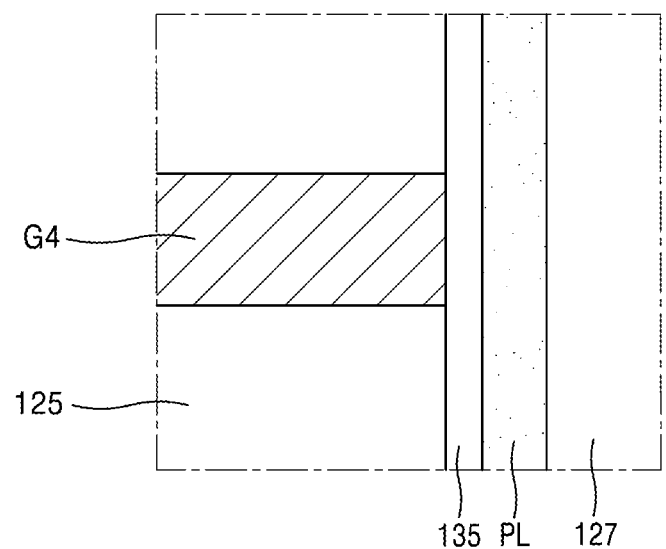
Figure 6H:
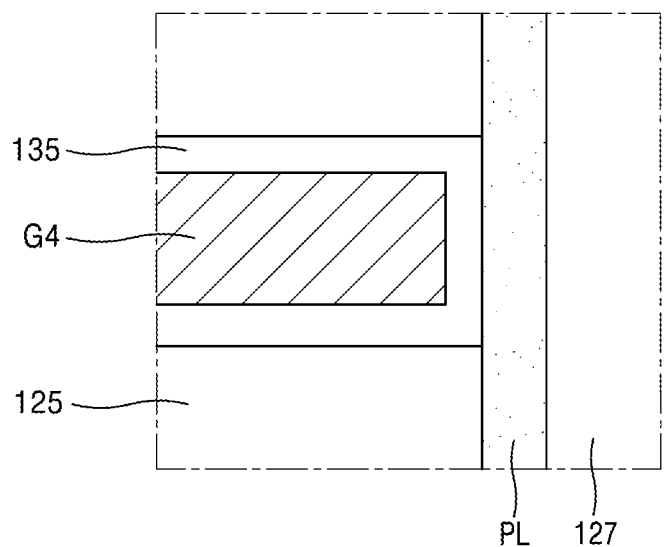

Referring to FIGS. 6F to 6H, the information storage element 135 may be a variable resistance pattern.

Referring to FIG. 6F, the information storage element 135 may be limited to be disposed between the gate electrode G4 and the vertical pillar PL unlike what is illustrated in FIG. 5.

Referring to FIG. 6G, the information storage element 135 may extend between the insulating patterns 125 and the vertical pillar PL.

Referring to FIG. 6H, the information storage element 135 may extend between the insulating patterns 125 and the gate electrode G4.

In example embodiments, the information storage element 135 may include a material whose electrical resistance may be varied depending on heat generated by current passing through its adjacent electrode, for example, a phase change material. The phase change material may include at least one of antimony (Sb), tellurium (Te), and selenium (Se). For example, the phase change material may include a chalcogenide compound in which tellurium (Te) has a concentration of about 20 to about 80 atomic percent, antimony (Sb) has a concentration of about 5 to about 50 atomic percent, and the rest is germanium (Ge). The phase change material may further include at least one selected from the group consisting of N, O, C, Bi, In, B, Sn, Si, Ti, Al, Ni, Fe, Dy, and La, as an impurity. Alternatively, the information storage element 135 may include one selected from the group consisting of GeBiTe, InSb, GeSb, and GaSb.

In example embodiments, the information storage element 135 may be formed to have a thin film structure having an electrical resistance that may be varied using a spin transfer procedure caused by current passing through the information storage element 135. The information storage element 135 may have a thin film structure to exhibit magnetoresistance characteristics and include, for example, at least one of ferromagnetic materials and/or at least one of antiferromagnetic materials. For example, the information storage element 135 may include a free layer, a pinned layer, and a barrier layer disposed between the free layer and the pinned layer.

The free layer may have a magnetization easy axis in a direction perpendicular to a surface of a film forming the free layer and a magnetization direction that varies depending on conditions. The pinned layer may have a magnetization easy axis in a direction perpendicular to a surface of a film forming the pinned layer and a pinned magnetization direction. A resistance value of the information storage element 135 may vary depending on the magnetization direction of the free layer. When the magnetization direction of the free layer is parallel to the magnetization direction of the pinned layer, the information storage element 135 may have a low resistance value and may store data "0". When the magnetization direction of the free layer is antiparallel to the magnetization direction of the pinned layer, the information storage element 135 may have a high resistance value and may store data "1".

Each of the free layer and the pinned layer may have interface perpendicular magnetic anisotropy (IPMA) in an interface with the barrier layer (that is, a contact surface). To this end, the free layer and the pinned layer may have a ferromagnetic material. The ferromagnetic material may have a relatively high magnetic anisotropy energy Ku of, for example, about 106 erg/cc to about 107 erg/cc. The free layer and the pinned layer may have a magnetization easy axis perpendicular to the interface due to the high magnetic anisotropy energy.

The free layer may be a magnetic layer having a variable magnetization direction. That is, the free layer may include a ferroelectric material having a magnetic moment in which a magnetization direction freely varies in a direction perpendicular to a layer surface, for example, at least one selected from the group consisting of Co, Fe and Ni and may further include another element, such as B, Cr, Pt, or Pd. The free layer may be formed of a material different from that of the pinned layer, or may be formed of a material substantially identical to that of the pinned layer. The pinned layer may be a magnetic layer having a pinned magnetization direction. A ferroelectric material forming the pinned layer may include at least one selected from the group consisting of Co, Fe and Ni and may further include another element, such as B, Cr, Pt, or Pd.

For example, the pinned layer may have a multi-layered structure in which a first layer formed of at least one of Co or Co alloy and a second layer formed of at least one of Pt, Ni, and Pd are alternately stacked, or may be a FePt layer or CoPt layer having an $L_{10}$ structure or may be an alloy layer of a rare-earth element and a transition metal. In this case, the rare-earth element may be at least one of Tb and Gd, and the transition metal may be at least one of Ni, Fe, and Co. Various alloy combinations of the rare-earth element and the transition metal may be used. For example, CoFeB or CoFe may be used as a material of the pinned layer.

The barrier layer may be disposed between the free layer and the pinned layer so as to increase a tunnel magnetoresistance ratio (TMR) of the information storage element 135. The barrier layer may have a thickness of about 8 Å to about 15 Å, but is not limited thereto. The barrier layer may have a thickness which is thinner than a spin diffusion distance. The barrier layer may include a nonmagnetic material. The barrier layer may include at least one selected from the group consisting of an oxide of magnesium (Mg), titanium (Ti), aluminum (Al), magnesium-zinc (MgZn) and magnesium-boron (MgB), and a nitride of titanium (Ti) and vanadium (V). The barrier layer may have, for example, a multi-layered structure.

The free layer, the barrier layer, and the pinned layer may have the same crystalline structure. For example, the free layer, the barrier layer, and the pinned layer may have a body centered cubic (BCC) crystalline structure respectively.

In example embodiments, the information storage element 135 may include at least one of perovskite compounds or transition metal oxides. For example, the information storage element 135 may include at least one selected from the group consisting of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide.

Figure 6I:
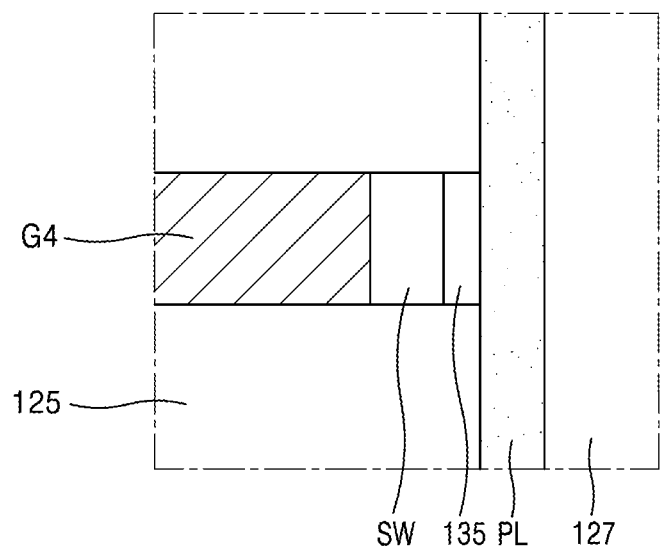

Referring to FIG. 6I, a self-rectifying material SW may be disposed between the information storage element 135 and the gate electrode G4. The self-rectifying material SW may have a self-rectifying property like, for example, a PN junction diode. Selectively, in FIGS. 6E, 6G, and 6H, the self-rectifying material SW may be disposed between the information storage element 135 and the gate electrode G4.

For example, FIGS. 6A to 6I are enlarged views of a portion including the fourth gate electrode G4 among the plurality of gate electrodes G1 to G6 illustrated in FIG. 5, but may be applied to a portion including any one of the first to third gate electrodes G1 to G3, the fifth gate electrode G5, and the sixth gate electrode G6. Alternatively, FIG. 6A to 6I may be applied to portions including the second gate electrode G2, the third gate electrode G3, and the fifth gate electrode G5 among the plurality of gate electrodes G1 to G6 illustrated in FIG. 5, and a film functioning as a gate dielectric film may be used in the information storage element 135 in portions including the first gate electrode G1 and the sixth gate electrode G6.

FIGS. 7 to 20 are plan views and cross-sectional views for describing a method of manufacturing a semiconductor memory device, according to example embodiments. Specifically, FIGS. 7, 9, 11, 13, 15, 17, and 19 are plan views corresponding to FIG. 4, and FIGS. 10, 12, 14, 16, 18 and 20 are cross-sectional views corresponding to FIG. 5. FIG. 8 is a cross-sectional view taken along line VIII-VIII' in FIG. 7. FIG. 10 is a cross-sectional view taken along line X-X' in FIG. 9. FIG. 12 is a cross-sectional view taken along line XII-XII' in FIG. 11. FIG. 14 is a cross-sectional view taken along line XIV-XIV' in FIG. 13. FIG. 16 is a cross-sectional view taken along line XVI-XVI' in FIG. 15. FIG. 18 is a cross-sectional view taken along line XVIII-XVIII' in FIG. 17. FIG. 20 is a cross-sectional view taken along line XX-XX' in FIG. 19.

Figure 7:
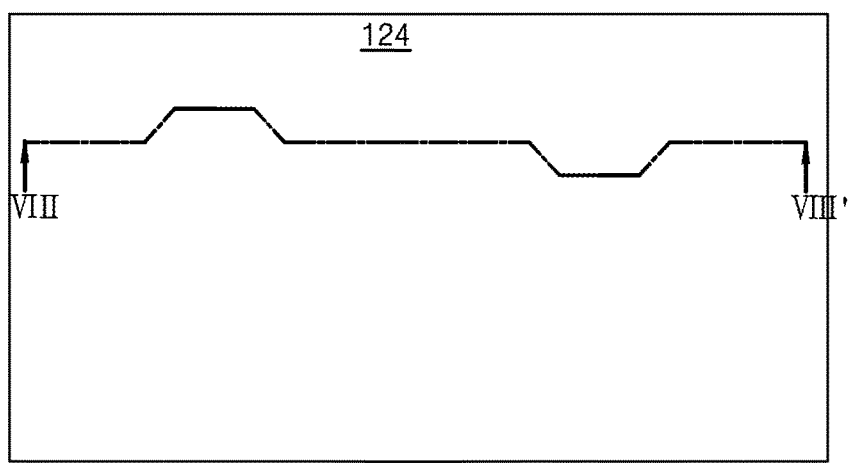
FIGS. 7 to 20 are plan views and cross-sectional views for describing a method of manufacturing a semiconductor memory device, according to example embodiments.
Figure 7:
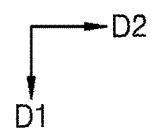
Figure 8:
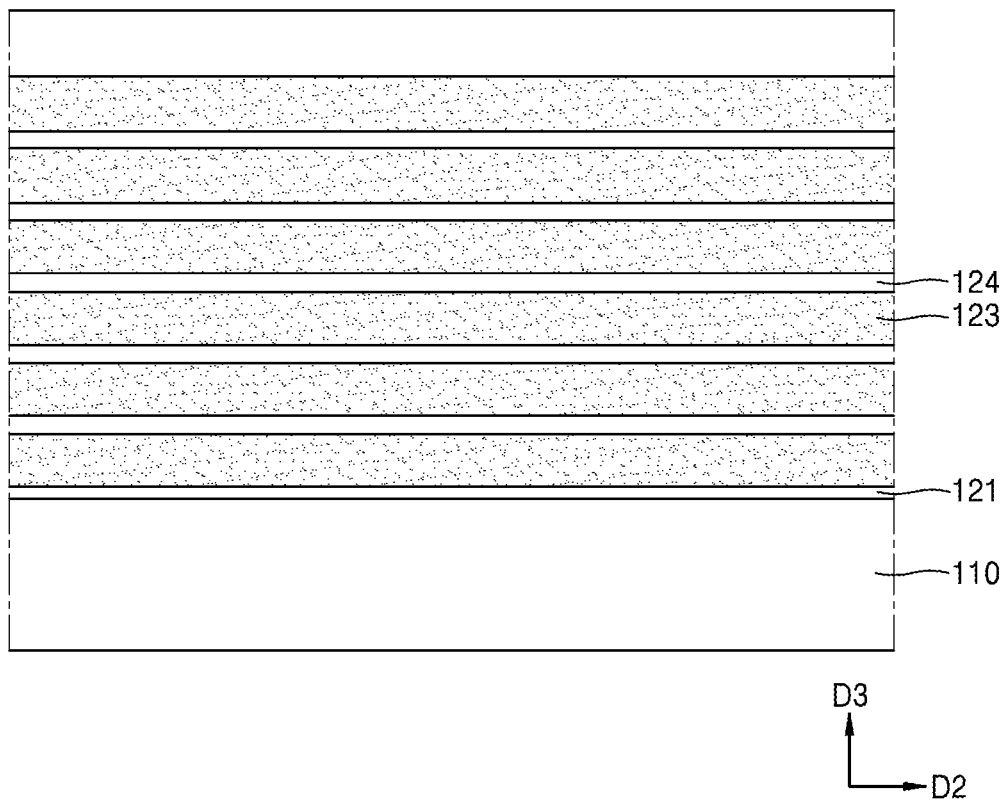

Referring to FIGS. 7 and 8, a substrate 110 is provided. The substrate 110 may have a first conductivity type, for example, a P type. A buffer dielectric film 121, a plurality of sacrificial films 123, and a plurality of insulating films 124 may be formed on the substrate 110. The buffer dielectric film 121 may include, for example, a silicon oxide, a silicon nitride, a silicon oxynitride, a gallium oxide, a germanium oxide, a high-k dielectric, or any combination thereof. The buffer dielectric film 121 may be silicon oxide formed by, for example, thermal oxidation. The sacrificial film 123 and the insulating film 124 may be alternately stacked on the buffer dielectric film 121. A thickness of the uppermost insulating film 124 may be thicker than those of other insulating films. The insulating film 124 may include, for example, a silicon oxide. The sacrificial film 123 may include a material having an etching select ratio with respect to the buffer dielectric film 121 and to the insulating film 124. For example, the sacrificial film 123 may include a material of which wet etching characteristics are different from those of the buffer dielectric film 121 and the insulating film 124. The sacrificial film 123 may include, for example, a silicon nitride film, a silicon oxynitride film, a polysilicon film, or a polysilicon-germanium film. The sacrificial film 123 and the insulating film 124 may be formed by, for example, chemical vapor deposition (CVD).

Figure 9:
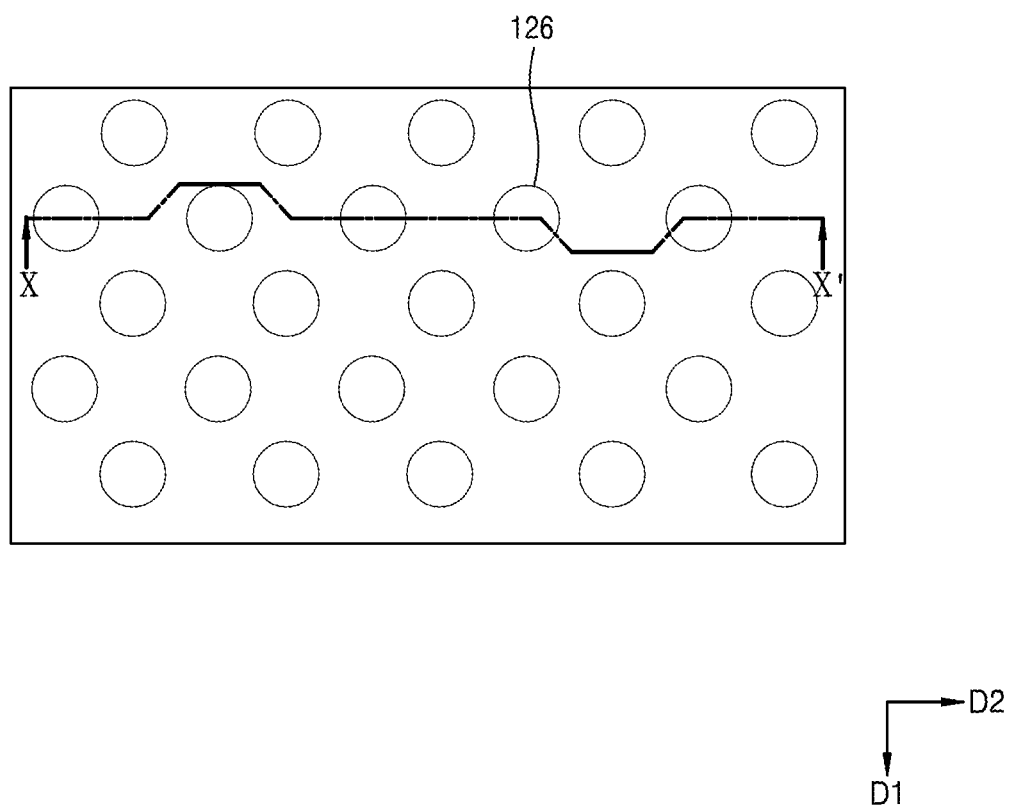
Figure 10:
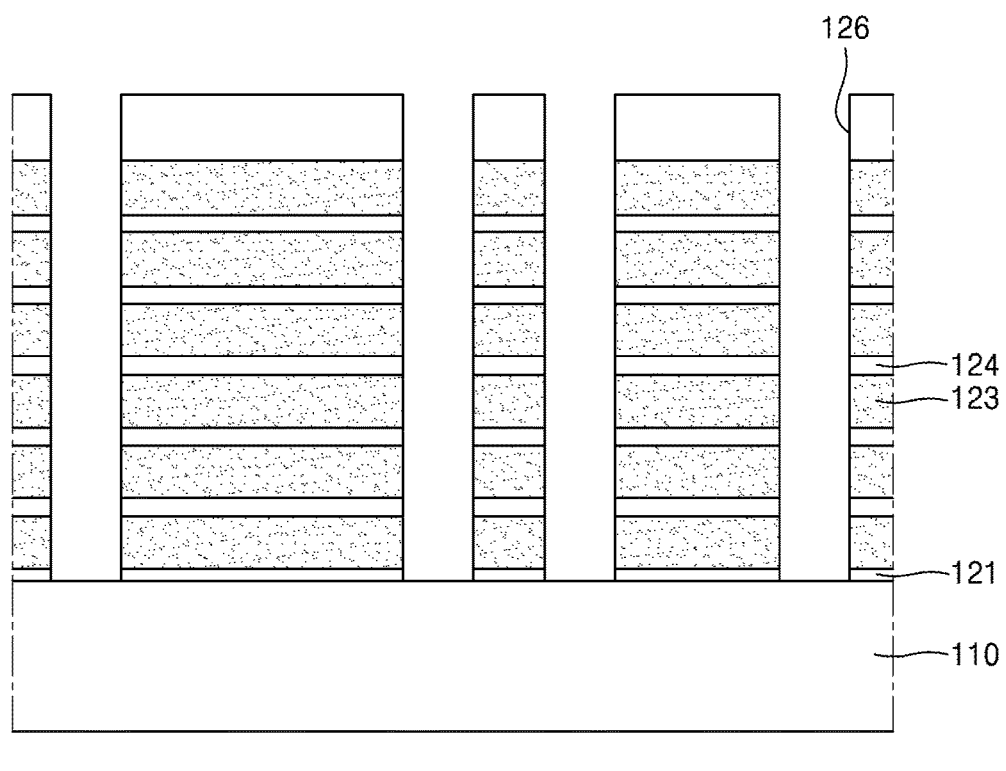

Referring to FIGS. 9 and 10, a plurality of vertical holes 126 exposing the substrate 110 may be formed by penetrating the buffer dielectric film 121, the plurality of sacrificial films 123, and the plurality of insulating film 124. Some of the plurality of vertical holes 126 may be disposed like the vertical pillars PL1, PL2, PL3, and PL4 described with reference to FIG. 4. The other vertical holes 126 may be disposed like a dummy vertical pillar PLD illustrated in FIG. 11. In example embodiments, the plurality of vertical holes 126 may be formed like the vertical pillars PL1, PL2, PL3, and PL4 described with reference to FIG. 4. The vertical holes 126 corresponding to the dummy vertical pillar PLD illustrated in FIG. 11 may be omitted.

Figure 11:
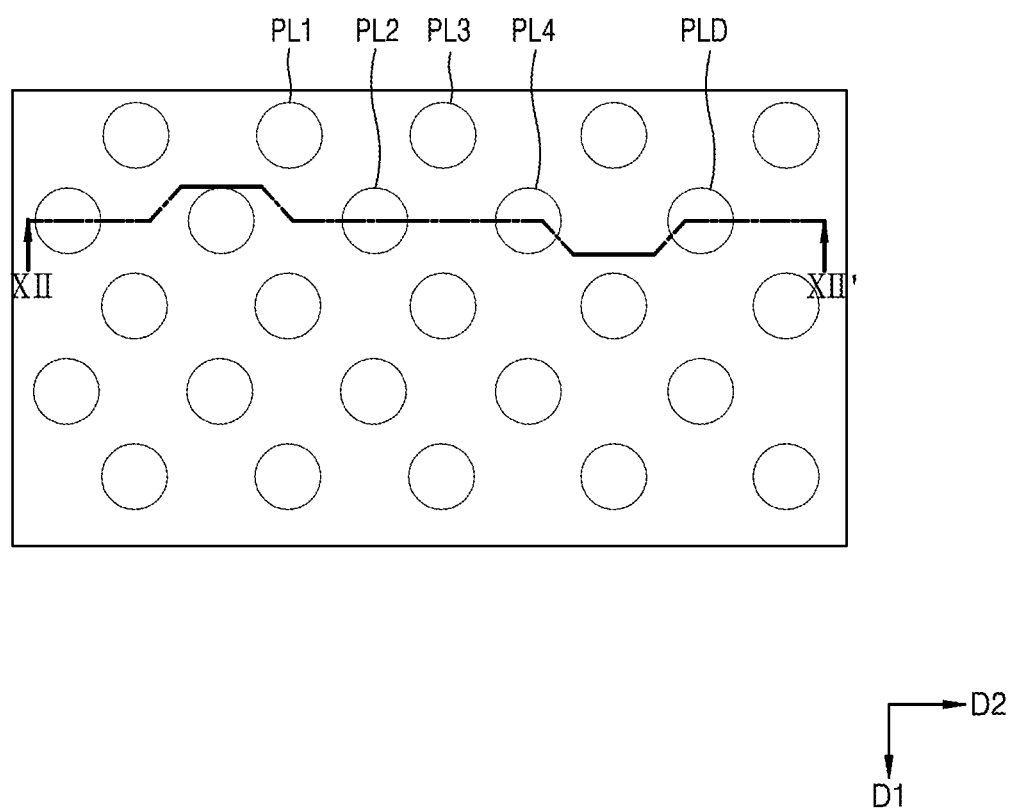
Figure 12:
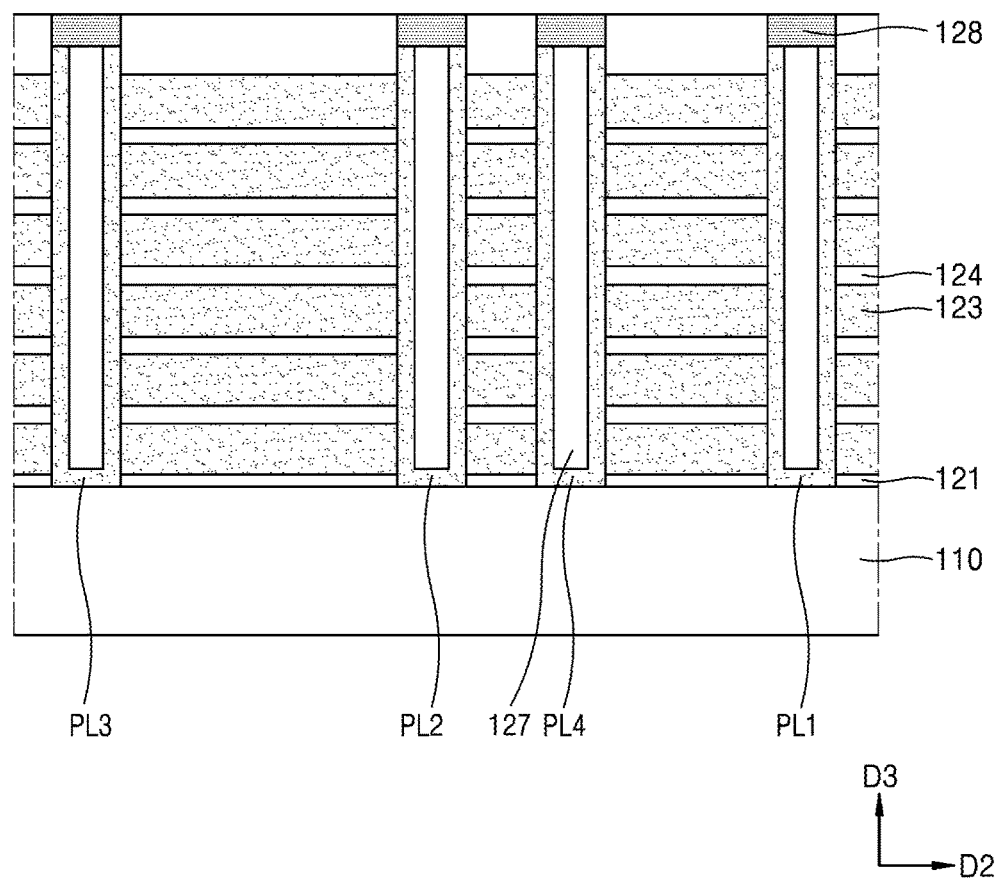

Referring to FIGS. 11 and 12, the vertical pillars PL1, PL2, PL3, and PL4, and the dummy vertical pillar PLD may be formed in the plurality of vertical holes (126 in FIGS. 9 and 10). The dummy vertical pillar PLD may be formed similarly to the vertical pillars PL1, PL2, PL3, and PL4. The dummy vertical pillar PLD may not be formed or be removed during formation of the isolation region 131 illustrated in FIG. 4, and therefore, a detailed description thereof will be omitted.

The vertical pillars PL1, PL2, PL3, and PL4 may be first-conductivity-type semiconductor films. The semiconductor film may be formed not to completely fill the plurality of vertical holes 126. An insulating material layer may be formed on the semiconductor film to completely fill the plurality of vertical holes 126. The semiconductor film and the insulating material layer may be planarized to expose the uppermost insulating film 124. Thus, the vertical pillars PL1, PL2, PL3, and PL4 may be formed to have hollow cylinder-shapes of which inner regions are filled with filling insulating films 127. The semiconductor film may be formed to completely the plurality of vertical holes 126 and the filling insulating films 127 may not be necessary. Upper portions of the vertical pillars PL1, PL2, PL3, and PL4 may be partially recessed and therefore, the vertical pillars PL1, PL2, PL3, and PL4 may have a top surface lower than a top surface of the uppermost insulating film 124. Conductive patterns 128 may be formed on upper portions of the vertical holes 126 which are spaces formed in such a way that the vertical pillars PL1, PL2, PL3, and PL4 are recessed. The conductive patterns 128 may be a doped polysilicon or a metal. Second-conductivity-type impurity ions may be injected into the upper portions of the vertical pillars PL and/or the conductive patterns 128 to form drain regions. For example, the second conductivity type may be an N-type.

In example embodiments, the vertical pillars PL1, PL2, PL3, and PL4 may be conductive pillars. The vertical pillars PL may include at least one conductive material of, for example, doped polysilicon, metal, conductive metal nitride, silicide, or nanostructures, such as carbon nanotubes or graphene.

Figure 13:
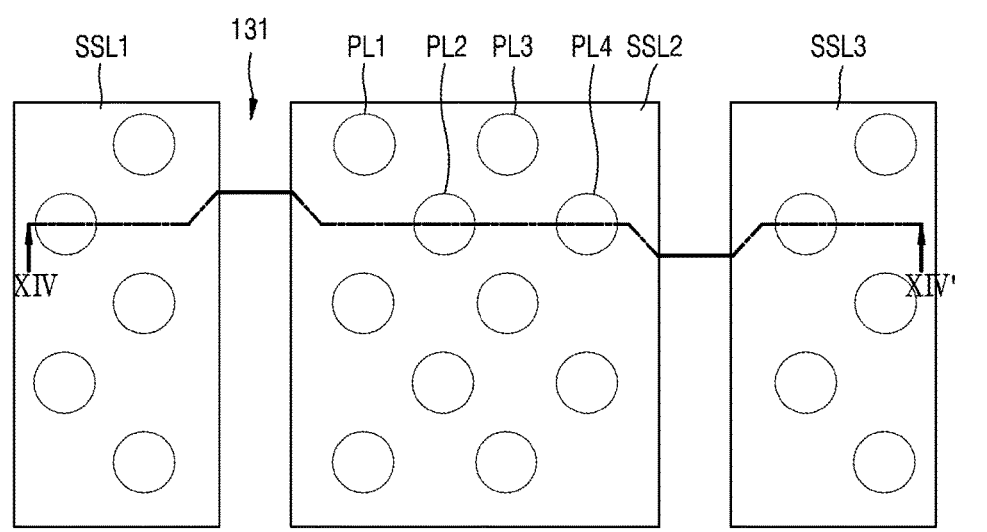
Figure 14:
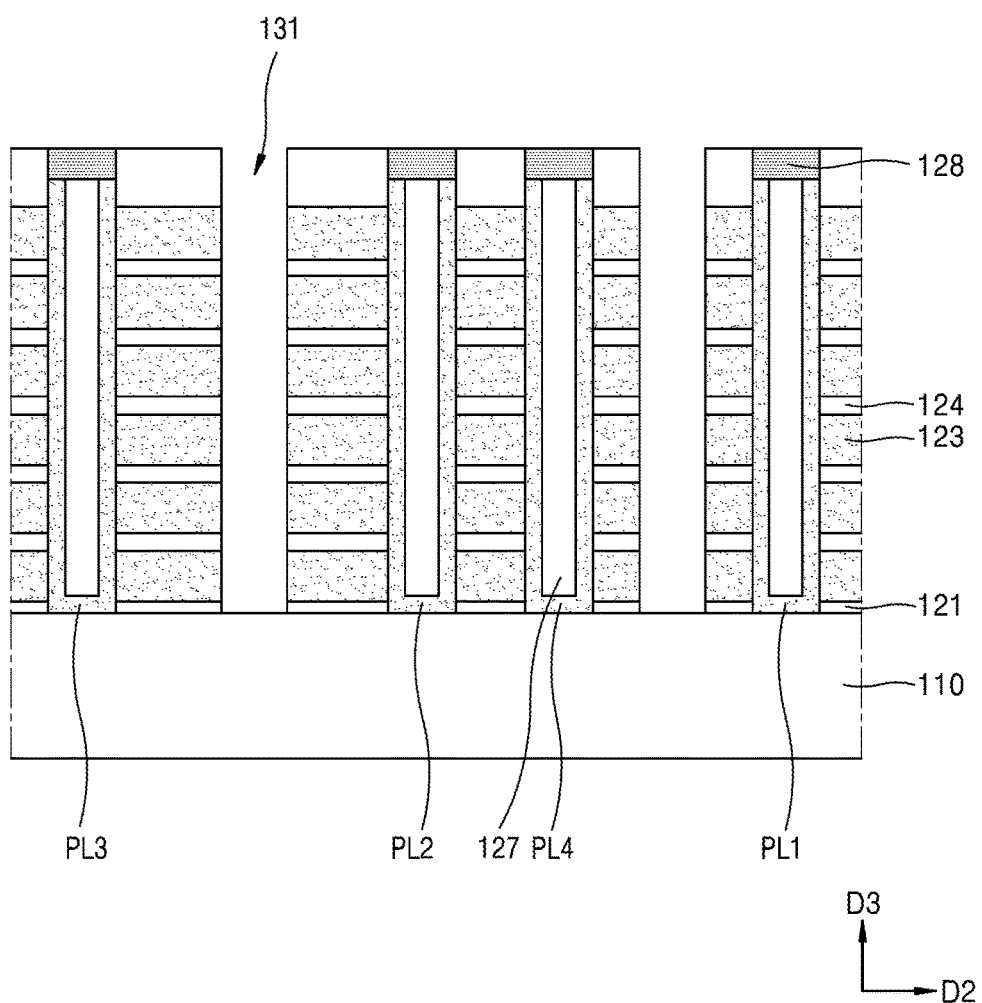

Referring to FIGS. 13 and 14, the buffer dielectric film 121, the plurality of sacrificial films 123, and the plurality of insulating film 124 may be successively patterned to form isolation regions 131 spaced apart from one another. The isolation regions 131 may extend in the first direction D1 and may expose the substrate 110. The patterned insulating films (124 in FIGS. 11 and 12) may correspond to insulating patterns 125. In a case where the dummy vertical pillar PLD illustrated in FIGS. 11 and 12 is formed, when the buffer dielectric film 121, the plurality of sacrificial films 123, and the plurality of insulating film 124 are successively patterned, the dummy vertical pillar PLD may be removed together, and the isolation regions 131 may be formed to extend in the first direction D1 in a portion in which the dummy vertical pillar PLD is formed and the vicinity thereof.

Figure 15:
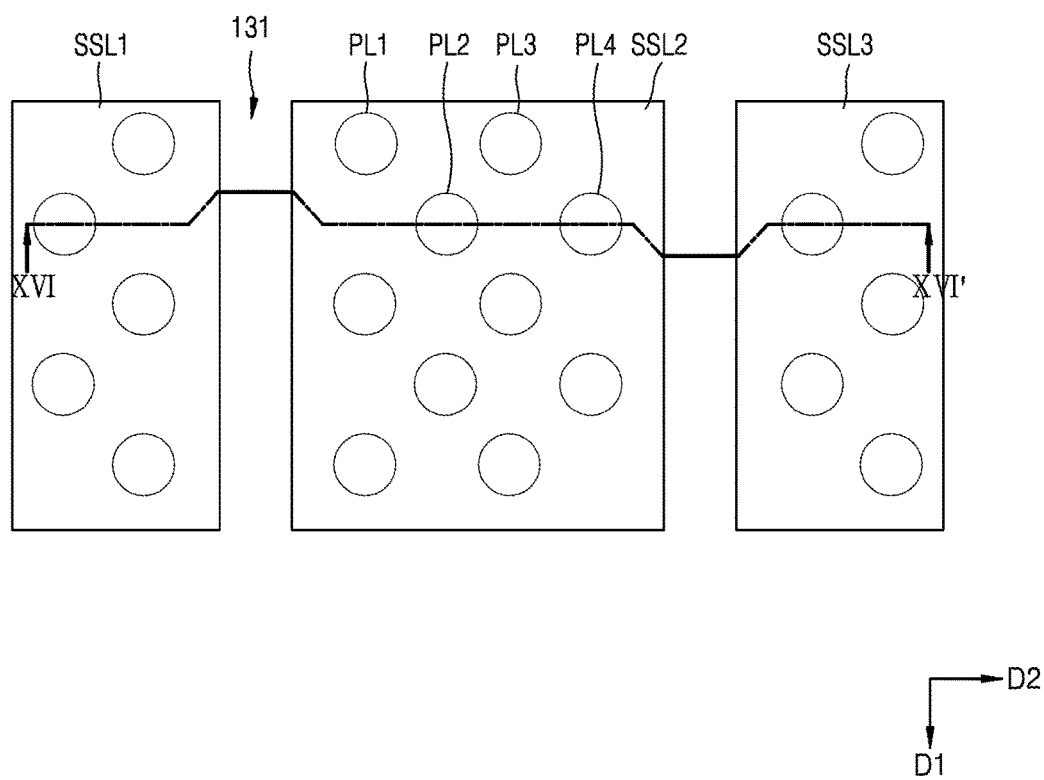
Figure 16:
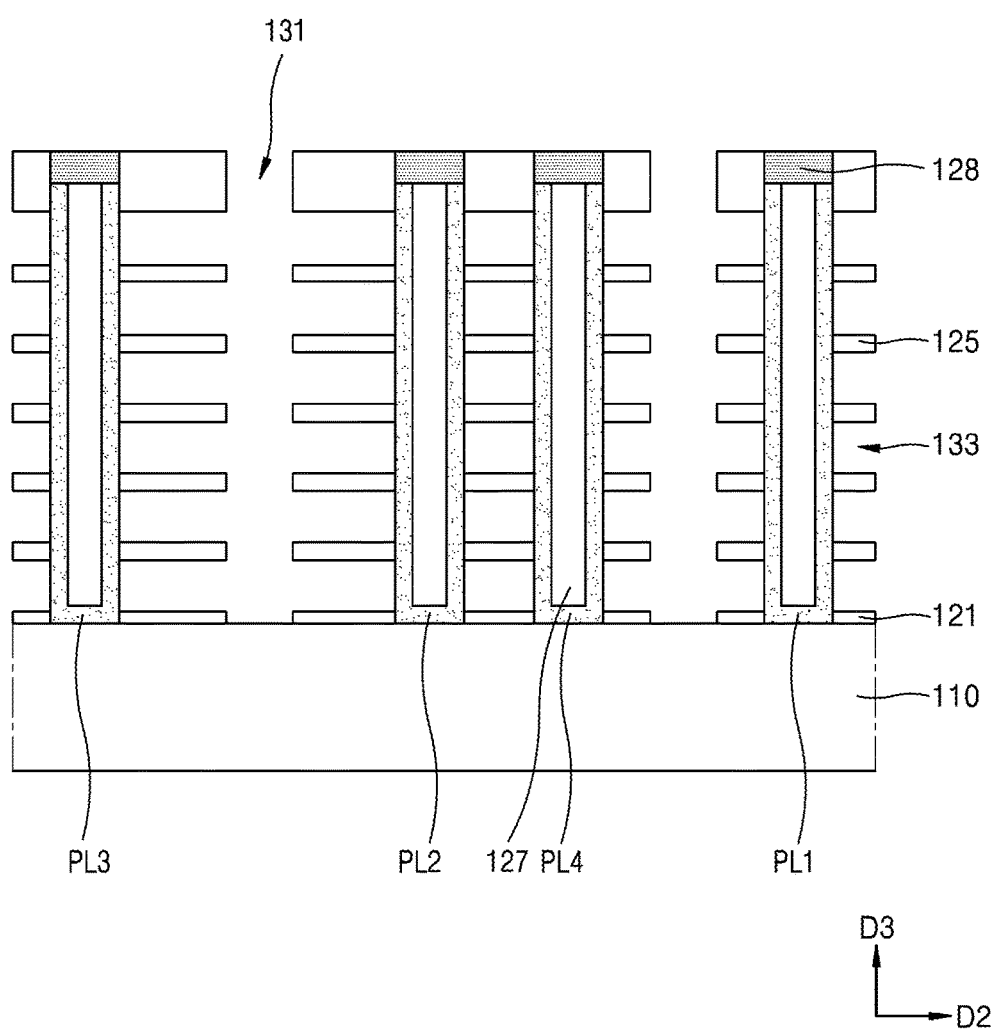

Referring to FIGS. 15 and 16, the sacrificial films (123 in FIG. 14) exposed by the isolation regions 131 may be selectively removed to form recess regions 133. The recess regions 133 may correspond to regions where the sacrificial films 123 are removed. The recess regions 133 may be defined by the vertical pillars PL1, PL2, PL3, and PL4 and the insulating patterns 125. When the sacrificial films 123 include silicon nitride films or silicon oxynitride films, the removal process of the sacrificial films 123 may be performed using a wet etching solution including phosphoric acid. Sidewalls of the vertical pillars PL1, PL2, PL3, and PL4 are partially exposed by the recess regions 133.

Figure 17:
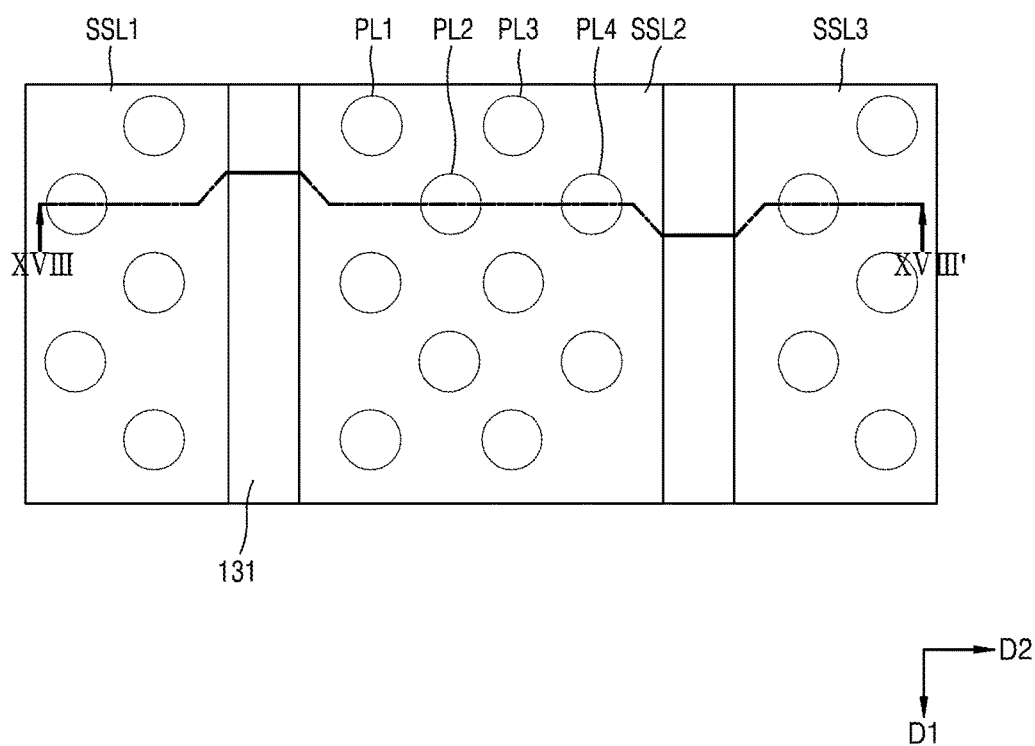
Figure 18:
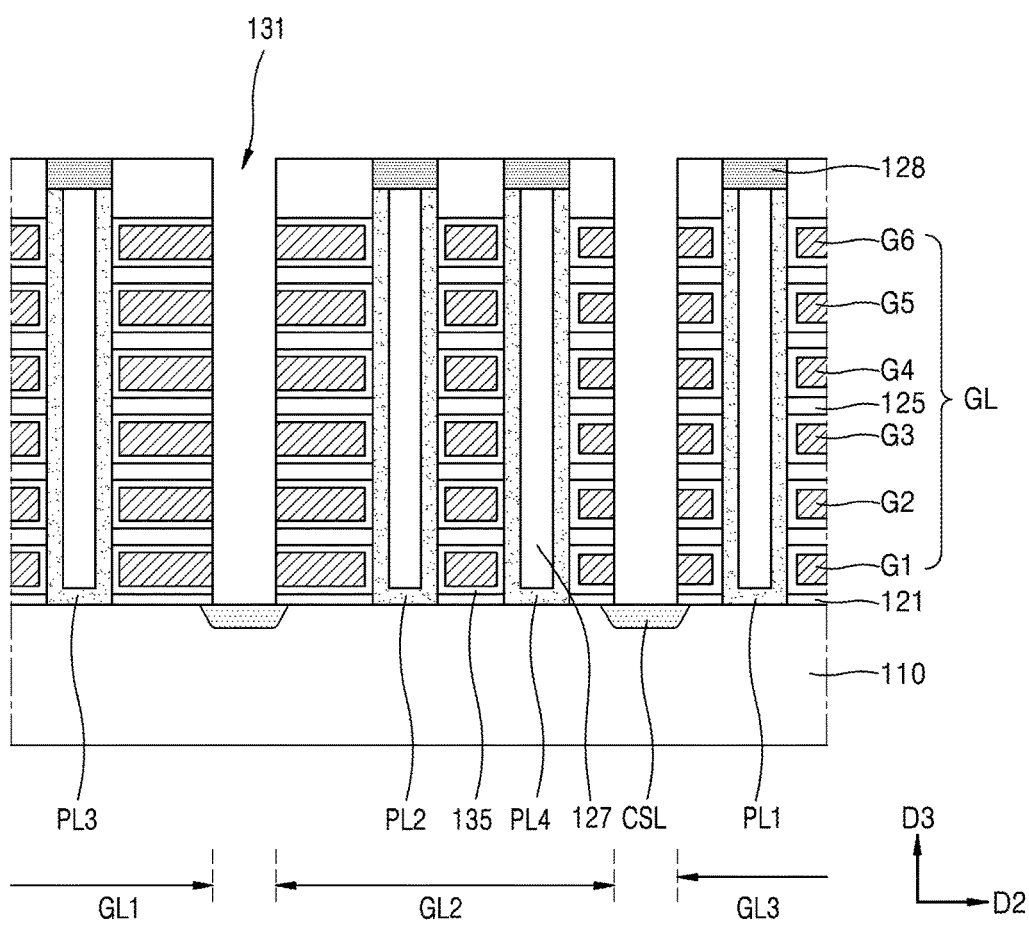

Referring to FIGS. 17 and 18, an information storage element 135 may be formed in a portion of the recess region 133 and a conductive film may be formed on the information storage element 135 to fill the remaining portion of the recess region 133 and the isolation region 131. The conductive film may include at least one of a doped silicon film, a metal film, a metal nitride film and a metal silicide film. The conductive film may be formed by an atomic layer deposition (ALD) process.

The conductive film formed in the isolation regions 131 may be removed to form gate electrodes G1 to G6 in the recess regions 133. The gate electrodes G1 to G6 may extend in the first direction D1. Gate structures GL may include the gate electrodes G1 to G6. The gate structures GL may include first to third gate structures GL1, GL2, and GL3 sequentially arranged in the second direction D2. In each of the gate structures GL, the first to fourth vertical pillars PL1, PL2, PL3, and PL4 which are arranged in a zigzag manner in the first direction D1 and the second direction D2 may be connected to one another.

Second-conductivity-type impurity ions may be injected into the substrate 110, which is exposed by removing the conductive film formed in the isolation regions 131, to form common source lines CSL.

In example embodiments, the information storage element 135 may include a tunnel insulating film contacting the vertical pillars PL1, PL2, PL3, and PL4, a charge storage film on the tunnel insulating film, and a blocking insulating film on the charge storage film (see FIG. 6A). In this case, the vertical pillars PL1, PL2, PL3, and PL4 may be semiconductor pillars. The tunnel insulating film may be formed by performing thermal oxidation on the vertical pillars PL1, PL2, PL3, and PL4 exposed by the recess region 133. On the other hand, the tunnel insulating film may be formed by an atomic layer deposition (ALD) method. Each of the charge storage film and the blocking insulating film may be formed by an ALD method and/or a chemical vapor deposition (CVD) method having an excellent step coverage property.

In example embodiments, when the information storage element 135 has one of the structures of FIGS. 6B to 6E, at least one of the tunnel insulating film, the charge storage film, and the blocking insulating layer included in the information storage element 135 may be formed in the vertical holes 126 before the vertical pillars PL are formed.

In example embodiments, as described with reference to FIGS. 6F to 6H, the information storage element 135 may be a variable resistance pattern. The vertical pillars PL1, PL2, PL3, and PL4 may be conductive pillars including at least one of, for example, a doped semiconductor, a metal, a conductive metal nitride, a silicide, or nanostructures, such as carbon nanotubes or graphene. When the information storage element 135 has the structure of FIG. 6G, the information storage element 135 may be formed in the vertical holes 126 before formation of the vertical pillars PL1, PL2, PL3, and PL4.

Figure 19:
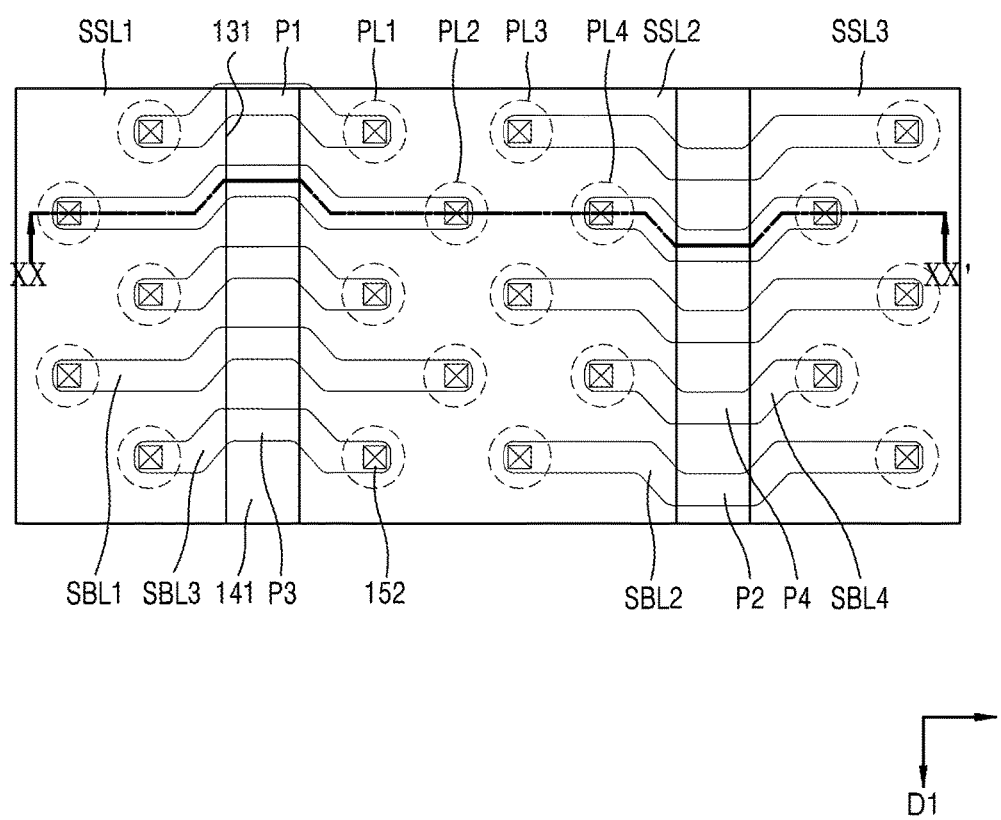
Figure 20:
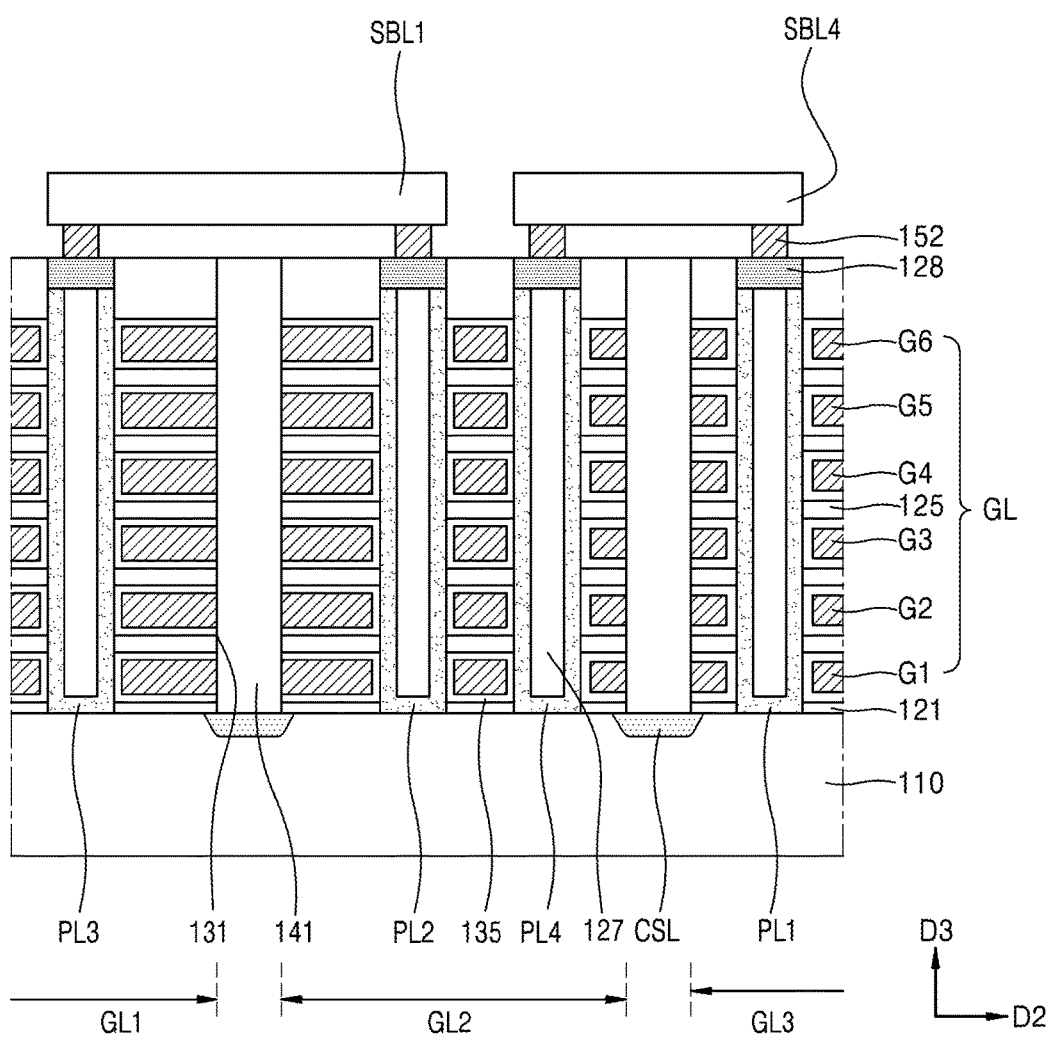

Referring to FIGS. 19 and 20, an isolation insulating film 141 filling the isolation regions 131 may be formed. Lower contact plugs 152 may be formed on the vertical pillars PL1, PL2, PL3, and PL4. Sub-interconnections SBL1, SBL2, SBL3, and SBL4 may be formed on the lower contact plugs 152. The sub-interconnections SBL1, SBL2, SBL3, and SBL4 may connect the vertical pillars PL1, PL2, PL3, and PL4 respectively connected to adjacent string select lines SSL1 and SSL2, or SSL2 and SSL3 one to one through the lower contact plugs 152.

As illustrated in FIGS. 3 to 5, upper contact plugs 154 may be formed on the sub-interconnections SBL1, SBL2, SBL3, and SBL4 and bitlines BL1, BL2, BL3, and BL4 may be formed on the upper contact plugs 154, forming the semiconductor memory device 1.

Figure 21:
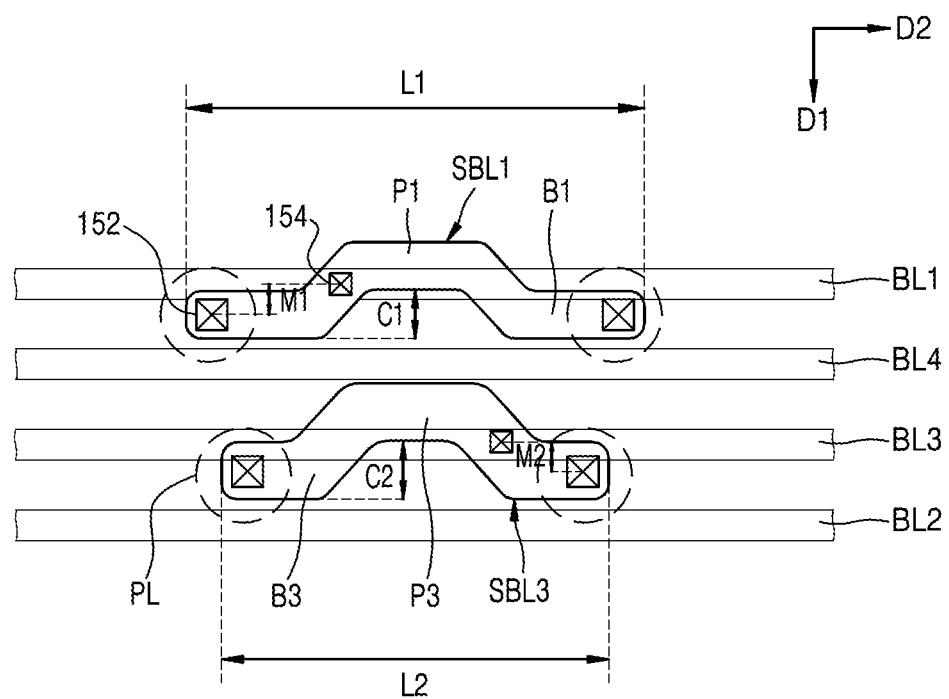
FIG. 21 is an enlarged view of sub-interconnections included in a semiconductor memory device, according to example embodiments.

FIG. 21 is an enlarged view of sub-interconnections included in a semiconductor memory device, according to example embodiments. Specifically, FIG. 21 is an enlarged view of the first and third sub-interconnections SBL1 and SBL3, that is, the long sub-interconnection SBL1 and the short sub-interconnection SBL3.

Referring to FIG. 21, the sub-interconnections SBL1 and SBL3 may have body portions B1 and B3 extending in the second direction D2 and protruding portions P1 and P3 curved and protruding from the body portions B1 and B3 in a direction opposite to the first direction D1. That is, the sub-interconnections SBL1 and SBL3 may have a pair of body portions B1 and B3 disposed on a pair of vertical pillars PL connected to each other therethrough and protruding portions P1 and P3 curved and protruding from an extending line connecting the pair of vertical pillars PL. Second sub-interconnections SBL1 and SBL3 may have rounded edges. The shape of the rounded edges may be formed by a photolithograpy process.

The long sub-interconnection SBL1 and the short sub-interconnection SBL3 may respectively have a first length L1 and a second length L2 with respect to the second direction D2. The first length L1 may be larger than the second length L2.

The protruding portions P1 and P3 of the long sub-interconnection SBL1 and the short sub-interconnection SBL3 may have a first protrusion distance C1 and a second protrusion distance C2 by which they protrude in the direction opposite to the first direction D1. In a photolithograpy process of forming fine patterns, the protruding portion P1 of the long sub-interconnection SBL1 having the first length which is relatively large may protrude less than the protruding portion P3 of the short sub-interconnection SBL3 having the second length which is relatively small. Therefore, the second protrusion distance C2 may be larger than the first protrusion distance C1.

A first interval M1 by which the lower contact plugs 152 and the upper contact plugs 154 connected to the long sub-interconnection SBL1 are shifted in the first direction D1 may be substantially equal to a second interval M2 by which the lower contact plugs 152 and the upper contact plugs 154 connected to the short sub-interconnection SBL3 are shifted in the first direction D1.

The upper contact plugs 154 may be disposed on the protruding portions P1 and P3 of the sub-interconnections SBL1 and SBL3 so as to be arranged in a zigzag manner in the first direction D1. Specifically, the upper contact plugs 154 may be disposed to be shifted toward one side from the centers of the sub-interconnections SBL1 and SBL3 in the second direction D2, that is, apexes of the protruding portions P1 and P3.

For example, the upper contact plug 154 disposed on the long sub-interconnection SBL1 may be disposed to be shifted from the apex of the protruding portion P1 of the long sub-interconnection SBL1 in a direction opposite to the second direction D2, and the upper contact plug 154 disposed on the short sub-interconnection SBL3 may be disposed to be shifted from the apex of the protruding portion P3 of the short sub-interconnection SBL3 in the second direction D2. In other words, the upper contact plug 154 disposed on the long sub-interconnection SBL1 and the upper contact plug 154 disposed on the short sub-interconnection SBL3 may be disposed to be shifted in opposite directions to each other.

Therefore, since an interval between the upper contact plugs 154 disposed on the long sub-interconnection SBL1 and the short sub-interconnection SBL3 increases, it is possible to form the bitlines BL1, BL2, BL3, and BL4 having a relatively small pitch, improving integration degree of the semiconductor memory device.

When the upper contact plugs are disposed at the apexes of the protruding portions of the sub-interconnections, misalignment between the sub-interconnections and the upper contact plugs may occur due to a difference in the protrusion distances of the protruding portions between the sub-interconnections.

According to example embodiments, the upper contact plugs 154 are disposed to be shifted from the apexes of the protruding portions P1 and P3 of the sub-interconnections SBL1 and SBL3, and therefore, a difference in the protrusion distances C1 and C2 of the protruding portions P1 and P3 between the sub-interconnections SBL1 and SBL3 may be less affected. Therefore, it is possible to limit and/or prevent misalignment between the sub-interconnections SBL1 and SBL3 and the upper contact plugs 154 in advance, and improve reliability of electrical connection between the sub-interconnections SBL1 and SBL3 and the bitlines BL1 and BL3.

The second and fourth sub-interconnections SBL2 and SBL4 illustrated in FIGS. 3 to 5 may have a shape vertically symmetric to a shape of the sub-interconnections SBL1 and SBL3, or a shape obtained by rotating the shape of the sub-interconnections SBL1 and SBL3 180 degrees, and a detailed description thereof will be omitted.

Figure 22:
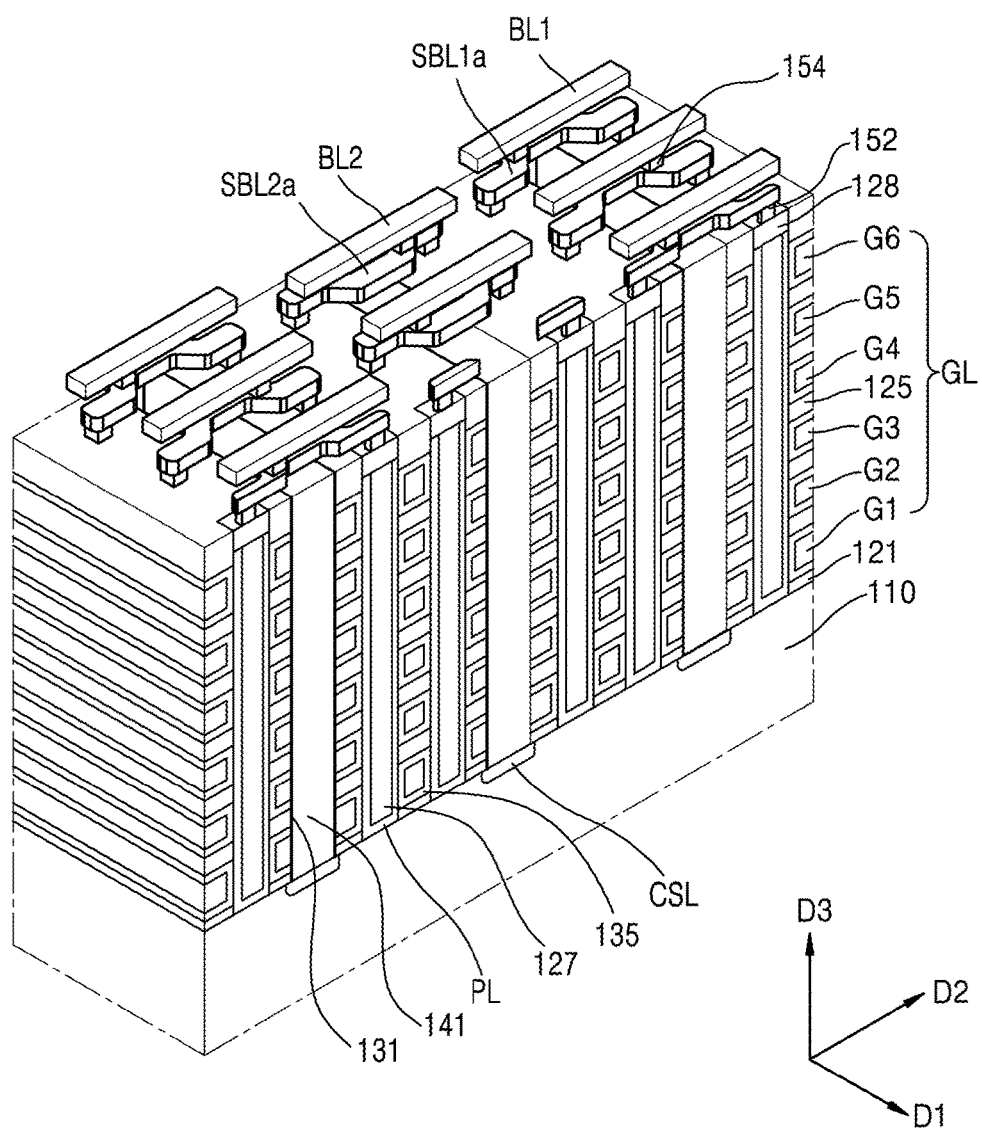
FIG. 22 is a perspective view of a memory block of a semiconductor memory device, according to example embodiments.
Figure 23:
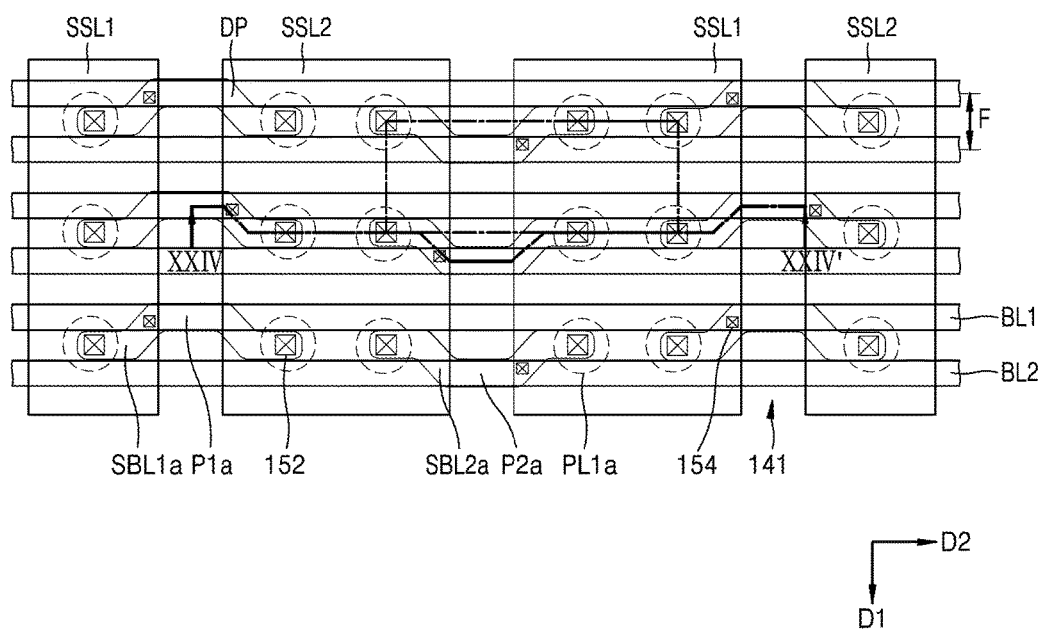
FIG. 23 is a plan view of the semiconductor memory device of FIG. 22.
Figure 24:
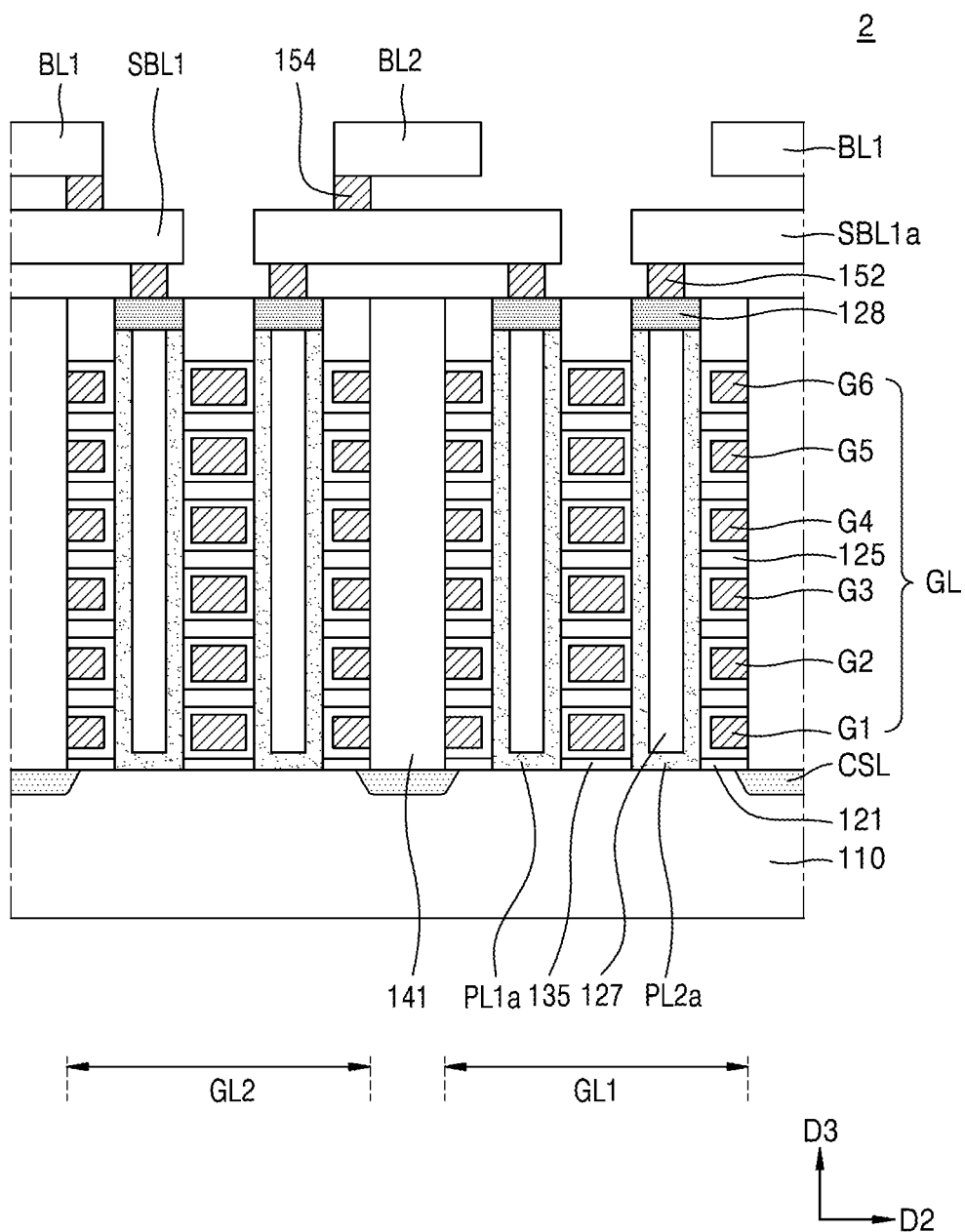
FIG. 24 is a cross-sectional view taken along line XXIV-XXIV' of FIG. 23.

FIG. 22 is a perspective view of a memory block of a semiconductor memory device 2, according to example embodiments. FIG. 23 is a plan view of the semiconductor memory device of FIG. 22. FIG. 24 is a cross-sectional view taken along line XXIV-XXIV' of FIG. 23. A description to the same technical features as described with reference to FIGS. 3 and 5 will be omitted and differences between FIGS. 22 to 24 and FIGS. 3 and 5 will be mainly described.

Referring to FIGS. 22 to 24, the semiconductor memory device 2 may include a plurality of vertical pillars PL arranged in a matrix form in the first direction D1 and the second direction D2. The plurality of vertical pillars PL may be connected to gate structures GL. One end of each of the plurality of vertical pillars PL may be connected to a substrate 110, and the other end may be connected to bitlines BL1 and BL2 extending in the second direction D2. Although the bitlines BL1 and BL2 are illustrated as having a bar shape, this is only for convenience of illustration. As illustrated in FIG. 23, the bitlines BL1 and BL2 may have a line shape extending in the second direction D2.

Sub-interconnections SBL1a and SBL1b are disposed between the vertical pillars PL and the bitlines BL1 and BL2. The vertical pillars PL may be connected to the sub-interconnections SBL1a and SBL1b through lower contact plugs 152. The bitlines BL1 and BL2 may be connected to the sub-interconnections SBL1a and SBL1b through upper contact plugs 154. The sub-interconnections SBL1a and SBL1b may connect vertical pillars PL connected to adjacent gate structures GL through the lower contact plugs 152.

The gate structures GL may include a first gate structure GL1 and a second gate structure GL2 adjacent to each other. A fifth gate electrode G6 of the first gate structure GL1 may be referred to as a first string select line SSL1, and a fifth gate electrode G6 of the second gate structure GL2 may be referred to as a first string select line SSL2. The first string select line SSL1 and the second string select line SSL2 may be alternately arranged in the second direction D2.

The vertical pillars may include a first vertical pillar PL1 and a second vertical pillar PL2 sequentially arranged in the second direction D2. The first and second vertical pillars PL1 and PL2 may be arranged in a matrix form in the first direction D1 and second direction D2. The vertical pillars PL1 and PL2 immediately adjacent to each other in the first direction D1 may be spaced apart from each other by, for example, two times a pitch of the bitlines BL1 and BL2.

The sub-interconnections SBL1a and SBL2a may connect vertical pillars PL1 and PL2 respectively connected to the first and second string select lines SSL1 and SSL2 immediately adjacent to each other. The sub-interconnections SBL1a and SBL2a may include a first sub-interconnection SBL1a and a second sub-interconnection SBL2a.

The first sub-interconnection SBL1a and the second sub-interconnection SBL2a may be arranged in the first direction D1. The first sub-interconnection SBL1a and the second sub-interconnection SBL2a may be alternately arranged in the second direction D2. The first sub-interconnections SBL1a and the second sub-interconnections SBL2a may be connected to other bitlines BL1 and BL2 adjacent to each other. The first sub-interconnection SBL1a may be connected to the first bitline BL1. The second sub-interconnection SBL2a may be connected to the second bitline BL2.

The first sub-interconnection SBL1a and the second sub-interconnection SBL2a may extend in the second direction D2. The first sub-interconnection SBL1a may have a first protruding portion P1a curved and protruding in a direction opposite to the first direction D1, and the second sub-interconnection SBL2a may have a second protruding portion P2a curved and protruding in the first direction D1. The protruding portions P1a and P2a may extend onto an isolation insulating film 141 between the gate structures GL1 and GL2. A length by which the first sub-interconnection SBL1a extends in the second direction D2 may be substantially equal to a length by which the second sub-interconnection SBL2a extends in the second direction D2.

The upper contact plugs 154 on the first sub-interconnection SBL1a may be arranged in a zigzag manner in the first direction D1. The upper contact plugs 154 on the second sub-interconnection SBL2a may be arranged in a zigzag manner in the first direction D1.

The upper contact plugs 154 on the first sub-interconnection SBL1a may be arranged such that an arrangement in which the upper contact plug 154 is disposed adjacent to the first string select line SSL1 and an arrangement in which the upper contact plug 154 is disposed adjacent to the second string select line SSL2 are alternately made in the first direction D1. Similarly, the upper contact plugs 154 on the second sub-interconnection SBL2a may be arranged such that an arrangement in which the upper contact plug 154 is disposed adjacent to the first string select line SSL1 and an arrangement in which the upper contact plug 154 is disposed adjacent to the second string select line SSL2 are alternately made in the first direction D1.

A shape and an arrangement of the first sub-interconnection SBL1a and the upper contact plugs 154 may be similar to a shape and an arrangement of one of the first sub-interconnection SBL1 and the third sub-interconnection SBL3 and the upper contact plugs 154 illustrated in FIG. 21 and theirs horizontally symmetric shape and arrangement, and a detailed description will be omitted. The second sub-interconnection SBL1b and the upper contact plugs 154 may have a shape and an arrangement vertically symmetric to a shape and an arrangement of the first sub-interconnections SBL1a and the upper contact plugs 154, or a shape and an arrangement obtained by rotating the shape and the arrangement of the first sub-interconnections SBL1a and the upper contact plugs 154 180 degrees, and a detailed description thereof will be omitted.

In the semiconductor memory device 2 according to example embodiments, the upper contact plugs 154 connecting the first and second sub-interconnections SBL1a and SBL2a and the bitlines BL1 and BL2 may be arranged in a zigzag manner. Therefore, it is possible to form the bitlines BL1 and BL2 having a relatively small pitch, improving integration degree of the semiconductor memory device 2.

Figure 25:
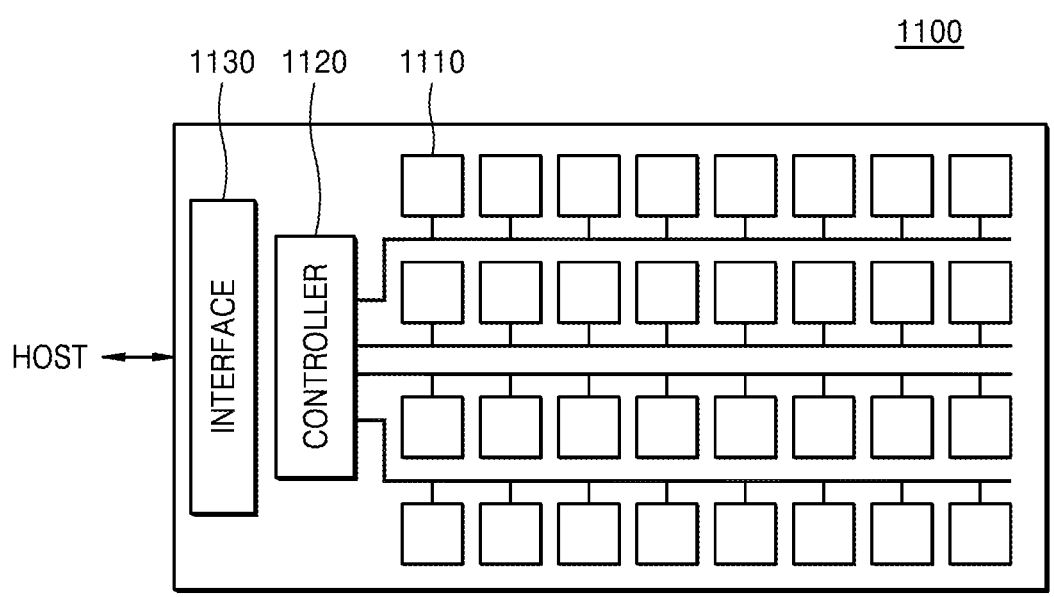
FIG. 25 is a configuration diagram of a solid state drive including a semiconductor memory device, according to example embodiments.

FIG. 25 is a configuration diagram of a solid state drive including a semiconductor memory device, according to example embodiments.

Referring to FIG. 25, a solid state drive package 1100 may include a plurality of non-volatile memories 1110 and a controller 1120. The non-volatile memory 1110 may be configured to store data. The non-volatile memory 1110 may have non-volatile characteristics such that stored data may be retained even when power is not supplied thereto. The non-volatile memory 1110 may be one of the semiconductor memory devices 1 and 2 described with reference to FIGS. 1 to 24.

The controller 1120 may read data stored in the non-volatile memory 1110 or may store data in the non-volatile memory 1110 in response to a read/write request from a host. The interface 1130 may transmit or receive a command and an address signal to and from the host. The interface 1130 may again transmit or receive the command and the address signal to and from the non-volatile memory 1110 through the controller 1120.

The solid state drive package 1100 may further include an active element or a passive element, such as a resistor, a capacitor, an inductance, a switch, a temperature sensor, a DC-DC converter, quartz for clock generation, or a voltage regulator.

Figure 26:
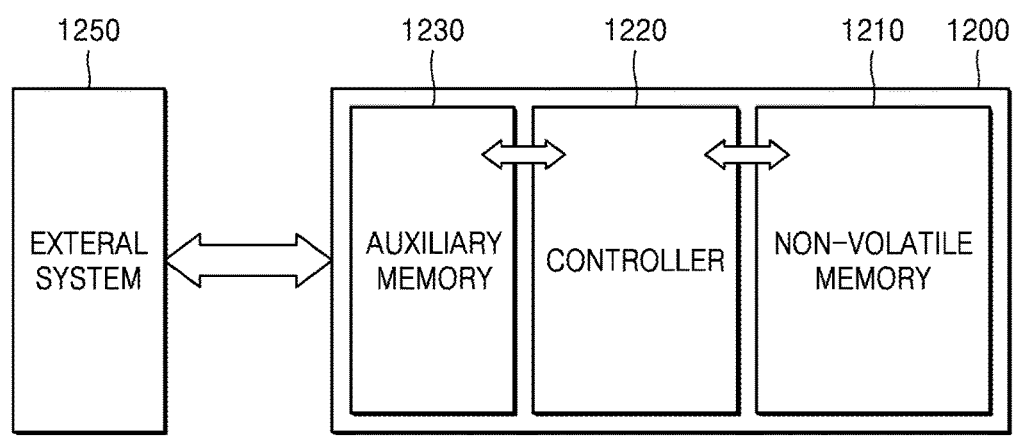
FIG. 26 is a schematic diagram for describing a relationship between a solid state drive including a semiconductor memory device, according to example embodiments, and an external system.

FIG. 26 is a schematic diagram for describing a relationship between a solid state drive including a semiconductor memory device, according to example embodiments, and an external system 1250.

Referring to FIG. 26, data input by the external system 1250 may be stored in a non-volatile memory 1210 through an auxiliary memory 1230 and a controller 1220. Also, the controller 1220 may read data from the non-volatile memory 1210 through the auxiliary memory 1230 and transmit the data to the external system 1250.

The non-volatile memory 1210 may be one of the semiconductor memory devices 1 and 2 described with reference to FIGS. 1 to 24.

Figure 27:
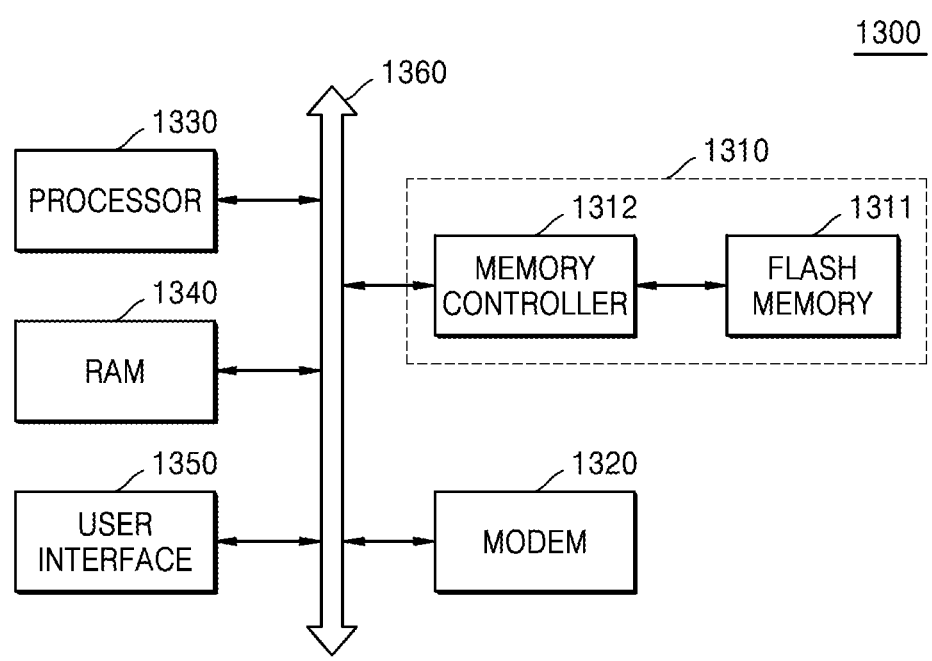
FIG. 27 is a block diagram of a data storage system using a semiconductor memory device, according to example embodiments.

FIG. 27 is a block diagram of a data storage system 1300 using a semiconductor memory device, according to example embodiments.

Referring to FIG. 27, the data storage system 1300 may include a processor 1330, such as a central processing unit (CPU) configured to perform communication through a common bus 1360, a random access memory 1340, a user interface 1350, and a modem 1320. Each of the components may transmit a signal to a storage device 1310 or receive a signal from the storage device 1310 through the common bus 1360. The storage device 1310 may include a flash memory 1311 and a memory controller 1312. The flash memory 1311 may store data. The flash memory 1311 may have non-volatile characteristics such that stored data may be retained even when power is not supplied thereto. The flash memory 1310 may be one of the semiconductor memory devices 1 and 2 described with reference to FIGS. 1 to 24.

Figure 28:
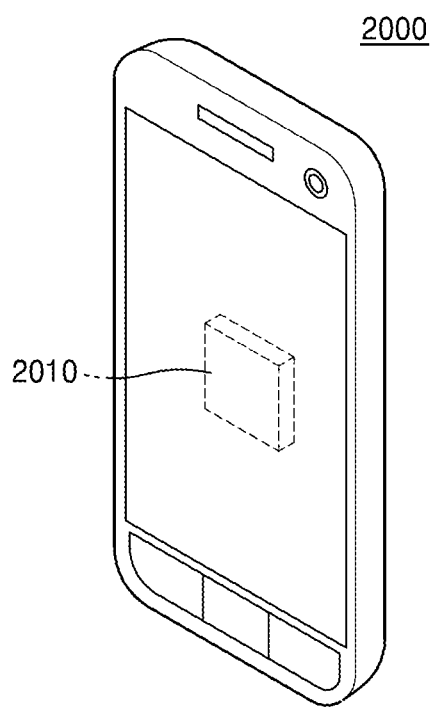
FIG. 28 is a perspective view of an electronic device including a semiconductor memory device, according to example embodiments.

FIG. 28 is a perspective view of an electronic device including a semiconductor memory device, according to example embodiments.

FIG. 28 illustrates an example in which the electronic device is applied to a mobile phone 2000. The mobile phone 2000 may include a semiconductor package 2010. The semiconductor package 1020 may include one of the semiconductor memory devices 1 and 2 described with reference to FIGS. 1 to 24.

Since the mobile phone 2000 uses a memory semiconductor device having increased integration degree, high speed, and improved reliability, the mobile phone 2000 may have high reliability, may be reduced in size, and may achieve high performance.

Figure 29:
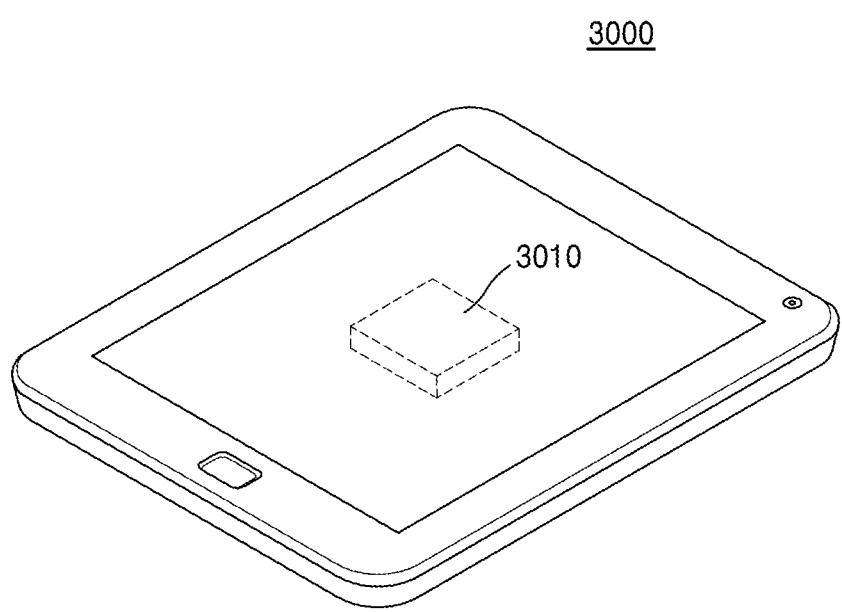
FIGS. 29 to 31 illustrate examples of a multimedia device to which a semiconductor memory device according to example embodiments is applied.
Figure 30:
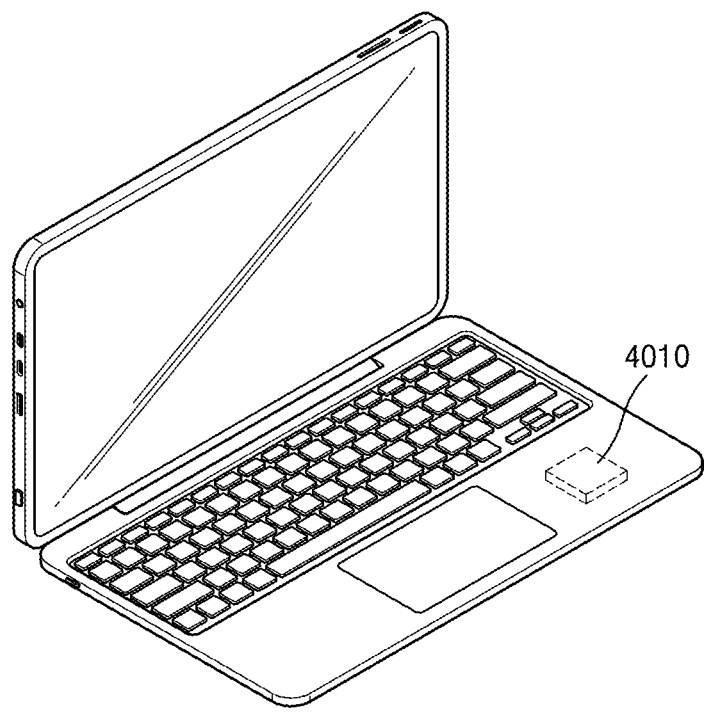
Figure 31:
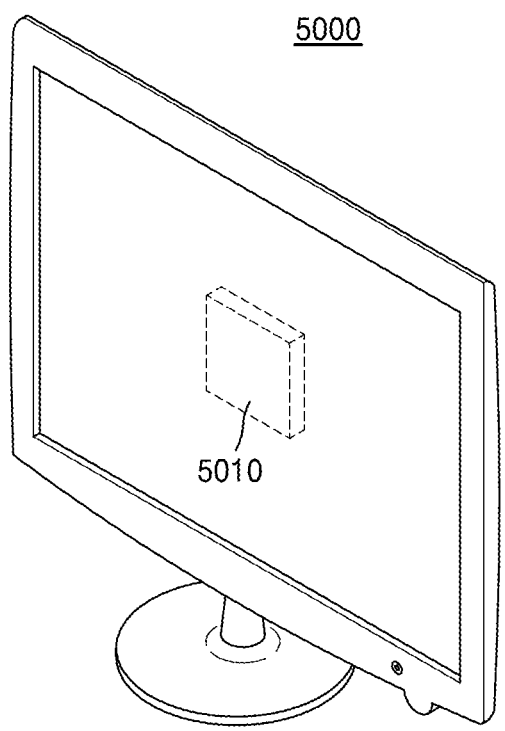

FIGS. 29 to 31 illustrate examples of a multimedia device to which a semiconductor memory device according to example embodiments is applied.

Referring to FIGS. 29 to 31, a semiconductor package according to example embodiments may be applied to various multimedia devices. For example, as illustrated in FIG. 29, the semiconductor package 3010 according to example embodiments may be applied to a tablet or a smart tablet 3000. Also, as illustrated in FIG. 30, a semiconductor package 4010 according to example embodiments may be applied to a notebook computer 4000. Also, as illustrated in FIG. 31, a semiconductor package 5010 according to example embodiments may be applied to a television or a smart television 5000.

Since the tablet or smart tablet 3000, the notebook computer 4000 and the television or smart television 5000 use a memory semiconductor device having increased integration degree, high speed, and improved reliability, they may have high reliability, may be reduced in size, and may achieve high performance.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor memory device comprising:
 string select lines extending in a first direction,
  the string select lines including odd string select lines alternately arranged with even string select lines in a second direction that intersects the first direction;
 a plurality of vertical pillars connected to the string select lines;
 sub-interconnections on the string select lines,
  the sub-interconnections each connecting a pair of the plurality of vertical pillars that respectively are connected to one of the odd string select lines and one of the even string select lines that are adjacent to each other from among the string select lines;
 bitlines connected to the plurality of vertical pillars through the sub-interconnections,
  the bitlines extending in the second direction; and
 upper contact plugs connecting the sub-interconnections to the bitlines,
  each of the upper contact plugs being between one of the sub-interconnections and one of the bitlines,
  a distance between each corresponding one of the upper contact plugs and one of the odd and even string select lines connected by a corresponding one of the sub-interconnections being less than a distance between the corresponding one of the upper contact plugs and an other one of the odd and even string select lines connected to the corresponding one of the sub-interconnections.

2. The semiconductor memory device of claim 1, wherein each of the sub-interconnections includes a pair of body portions and a protruding portion,
 the pair of body portions is on the pair of the plurality of vertical pillars connected to each other via the sub-interconnections,
 the protruding portion is curved, and
 the protruding portion protrudes from an extending line connecting the pair of vertical pillars.

3. The semiconductor memory device of claim 2, wherein the upper contact plugs are on the protruding portions of the sub-interconnections connected to the upper contact plugs.

4. The semiconductor memory device of claim 2, wherein the vertical pillars are arranged in a zigzag manner.

5. The semiconductor memory device of claim 4, wherein the sub-interconnections include a long sub-interconnection having a first length in the second direction and a short sub-interconnection having a second length in the second direction,
 the second length is smaller than the first length, and the long sub-interconnection and the short sub-interconnection are alternately arranged in the first direction.

6. The semiconductor memory device of claim 5, wherein a protrusion distance by which a protruding portion of the short sub-interconnection protrudes in the first direction is larger than a protrusion distance by which a protruding portion of the long sub-interconnection protrudes in the first direction.

7. The semiconductor memory device of claim 6, further comprising:
lower contact plugs on the plurality of vertical pillars, wherein
the lower contact plugs connect the plurality of vertical pillars to the sub-interconnections,
an interval by which the lower contact plugs and the upper contact plugs connected to the long sub-interconnections are shifted in the first direction is substantially equal to an interval by which the lower contact plugs and the upper contact plugs connected to the short sub-interconnections are shifted in the first direction.

8. The semiconductor memory device of claim 5, wherein the upper contact plugs that are respectively connected to the long sub-interconnection and the short sub-interconnection are on top of different string select lines among the string select lines.

9. The semiconductor memory device of claim 5, wherein the protruding portions of the long sub-interconnection and the short sub-interconnection are arranged in a line in the first direction.

10. The semiconductor memory device of claim 9, wherein the upper contact plugs are arranged in a zigzag manner.

11. The semiconductor memory device of claim 2, wherein
the string select lines include first to third string select lines sequentially arranged in the second direction,
the odd string select lines include the first and third string select lines,
the even string select lines include the second string select line,
the sub-interconnections include first sub-interconnections and second sub-interconnections,
the first sub-interconnections each connect two of the vertical pillars respectively connected to the first and second string select lines,
the second sub-interconnections each connect two of the vertical pillars respectively connected to the second and third string select lines,
the first sub-interconnections are curved and protrude in the first direction, and
the second sub-interconnections are curved and protrude in a direction opposite to the first direction.

12. The semiconductor memory device of claim 11, wherein
the first sub-interconnections include first long sub-interconnections having a first length in the second direction and first short sub-interconnections having a second length in the second direction that is smaller than the first length,
the second sub-interconnections include second long sub-interconnections having the first length in the second direction and second short sub-interconnections having the second length in the second direction,
the vertical pillars connected to the second string select lines include first to fourth vertical pillars respectively connected to the first long sub-interconnections, the first short sub-interconnections, the second long sub-interconnections, and the second short sub-interconnections,
the first and second vertical pillars are alternately arranged adjacent to the first string select line in a zigzag manner, and
the third and fourth vertical pillars are alternately arranged adjacent to the third string select line in a zigzag manner.

13. The semiconductor memory device of claim 12, wherein an interval between the first vertical pillar and the fourth vertical pillar in the second direction is substantially equal to an interval between the second vertical pillar and the third vertical pillar in the second direction.

14. A semiconductor memory device comprising:
a string select line extending in a first direction;
first and second vertical pillars connected to the string select line, the first and second vertical pillars arranged in a zigzag manner;
a first lower contact plug on the first vertical pillar;
a first sub-interconnection connected to the first vertical pillar through the first lower contact plug,
the first sub-interconnection extending in a second direction;
a second lower contact plug on the second vertical pillar;
a second sub-interconnection connected to the second vertical pillar through the second lower contact plug,
the second sub-interconnection extending in the second direction,
a length of the second sub-interconnection being different than a length of the first sub-interconnection;
a first bitline on the string select line and extending in the second direction;
a first upper contact plug connecting the first bitline to the first sub-interconnection,
the first upper contact plug in a plan view being shifted from the first vertical pillar in the first direction;
a second bitline on the string select line and extending in the second direction; and
a second upper contact plug connecting the second bitline to the second sub-interconnection, the second upper contact plug in the plan view being shifted from the second vertical pillar in the first direction,
the first upper contact plug and the second upper contact plug being arranged in a zigzag manner in the plan view.

15. The semiconductor memory device of claim 14, wherein
each of the first and second sub-interconnections includes a body portion and a protruding portion extending in the second direction,
the protruding portion is curved and protrudes from the body portion in the first direction,
the first upper contact plug is on the protruding portion of the first sub-interconnection, and
the second upper contact plug is on the protruding portion of the second sub-interconnection.

16. A semiconductor memory device comprising:
string select lines extending in a first direction,
the string select lines being spaced apart from each other in a second direction that crosses the first direction;
vertical pillars extending a third direction through the string select lines,
the vertical pillars being spaced apart from each other, the third direction being perpendicular to a top surface of the string select lines;

sub-interconnections on top of the vertical pillars,
   each of the sub-interconnections including two end portions that are respectively on top of and connected to two different vertical pillars that respectively extend through two different string select lines among the vertical pillars and the string select lines;
bitlines on top of the sub-interconnections; and
upper contact plugs between the bitlines and the sub-interconnections,
   each of the upper contact plugs being arranged between one of the bitlines and one of the string select lines in the third direction so as to not overlap the vertical pillars in a plan view.

17. The semiconductor memory device of claim 16, further comprising:
   gate lines spaced apart from each other in the third direction;
   a substrate including a common source line; and
   information storage elements between the vertical pillars and the gate lines, wherein
   the gate lines are on the substrate,
   the string select lines are on the gate lines, and
   the vertical pillars extend through the gate lines.

18. The semiconductor memory device of claim 16, wherein
   the sub-interconnections include long sub-interconnections having a first length in the second direction and short sub-interconnections having a second length in the second direction that is smaller than the first length,
   the long sub-interconnections and the short sub-interconnections are alternately arranged in the first direction, and
   the long sub-interconnections and the short sub-interconnections are alternately arranged in the second direction.

19. The semiconductor memory device of claim 16, wherein
   the sub-interconnections each include a protruding portion,
   the protruding portions are over spaces between the string select lines,
   the string select lines include first to third string select lines spaced apart from each other in the second direction,
   the second string select line is between the first and third string select lines,
   the protruding portions of the sub-interconnections that connect the first string select line to the second string select line protrude in a direction opposite the first direction in the plan view, and
   the protruding portions of the sub-interconnections that connect the second string select line to the third string select line protrude in the first direction in the plan view.

20. The semiconductor memory device of claim 19, wherein
   the protruding portions include diagonal portions that connect to the end portions of the sub-interconnections, and
   the upper contact plugs are between the bitlines and one of the diagonal portions in each of the sub-interconnections in the third direction.

* * * * *